(12) United States Patent
Ohsawa et al.

(10) Patent No.: US 8,587,904 B2
(45) Date of Patent: Nov. 19, 2013

(54) SUSPENSION BOARD WITH CIRCUIT HAVING A LIGHT EMITTING DEVICE EXPOSED FROM A SURFACE THEREOF OPPOSITE TO THAT ON WHICH A SLIDER IS MOUNTED

(75) Inventors: Tetsuya Ohsawa, Osaka (JP); Hayato Abe, Osaka (JP); Yoshinari Yoshida, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 956 days.

(21) Appl. No.: 12/588,797

(22) Filed: Oct. 28, 2009

(65) Prior Publication Data

US 2010/0110590 A1    May 6, 2010

Related U.S. Application Data

(60) Provisional application No. 61/193,272, filed on Nov. 12, 2008.

(30) Foreign Application Priority Data

Oct. 31, 2008 (JP) .................................. 2008-282166

(51) Int. Cl.
*G11B 5/48* (2006.01)
*G11B 13/08* (2006.01)

(52) U.S. Cl.
USPC .................... 360/245.8; 360/244.1; 360/244.3

(58) Field of Classification Search
USPC .................................................. 360/244–246
See application file for complete search history.

(56) References Cited

U.S. PATENT DOCUMENTS

| | | | |
|---|---|---|---|
| 5,896,248 A * | 4/1999 | Hanrahan et al. | 360/245.3 |
| 6,400,529 B1 | 6/2002 | Baba et al. | |
| 6,404,706 B1 * | 6/2002 | Stovall et al. | 369/13.17 |
| 6,459,548 B1 | 10/2002 | Shiraishi et al. | |
| 2001/0021086 A1 | 9/2001 | Kuwajima et al. | |
| 2002/0007961 A1 | 1/2002 | Yamato et al. | |
| 2003/0179697 A1 | 9/2003 | Kuwajima et al. | |
| 2004/0095663 A1 | 5/2004 | Kuwajima et al. | |
| 2004/0095685 A1 | 5/2004 | Kuwajima et al. | |
| 2004/0095686 A1 | 5/2004 | Kuwajima et al. | |
| 2004/0100736 A1 | 5/2004 | Kuwajima et al. | |
| 2004/0120064 A1* | 6/2004 | Dugas et al. | 360/59 |
| 2006/0187564 A1 | 8/2006 | Sato et al. | |
| 2007/0044999 A1 | 3/2007 | Shibata et al. | |
| 2007/0177302 A1 | 8/2007 | Shimazawa et al. | |

(Continued)

FOREIGN PATENT DOCUMENTS

| | | | |
|---|---|---|---|
| JP | 2000-348451 A | 12/2000 | |
| JP | 2001-023138 A | 1/2001 | |

(Continued)

*Primary Examiner* — Craig A. Renner
(74) *Attorney, Agent, or Firm* — Jean C. Edwards; Edwards Neils PLLC

(57) ABSTRACT

A suspension board with circuit includes a conductive pattern, including a slider arranged on a surface side of the suspension board with circuit and mounted with a magnetic head, the magnetic head being electrically connected with the conductive pattern; and a light emitting device arranged on the back surface side of the suspension board with circuit and electrically connected with the conductive pattern, in which the conductive pattern includes a first terminal provided on a surface of the suspension board with circuit and electrically connected with the magnetic head; and a second terminal provided on the back surface of the suspension board with circuit and electrically connected with the light emitting device.

13 Claims, 32 Drawing Sheets

(56) References Cited

U.S. PATENT DOCUMENTS

| | | |
|---|---|---|
| 2007/0242921 A1 | 10/2007 | Matsumoto |
| 2008/0115962 A1 | 5/2008 | Juni et al. |
| 2008/0130155 A1 | 6/2008 | Naniwa et al. |
| 2009/0262448 A1* | 10/2009 | Shimazawa et al. ............ 360/59 |
| 2010/0085846 A1* | 4/2010 | Shimazawa et al. ....... 369/13.14 |
| 2010/0097724 A1* | 4/2010 | Shimazawa et al. ....... 360/245.4 |

FOREIGN PATENT DOCUMENTS

| | | |
|---|---|---|
| JP | 2001-216748 A | 8/2001 |
| JP | 2001-352137 A | 12/2001 |
| JP | 2002-076557 A | 3/2002 |
| JP | 2002-223051 A | 8/2002 |
| JP | 2003-045004 A | 2/2003 |
| JP | 2004-342288 | 12/2004 |
| JP | 2006-500782 | 1/2006 |
| JP | 2006-185548 | 7/2006 |
| JP | 2007-052918 | 3/2007 |
| JP | 2007-067120 A | 3/2007 |
| JP | 2007-207349 | 8/2007 |
| JP | 2007-280572 | 10/2007 |
| JP | 2008-130106 | 6/2008 |
| JP | 2008-152899 | 7/2008 |
| WO | WO 2004/030427 | 4/2004 |

* cited by examiner

FIG. 5
(a)
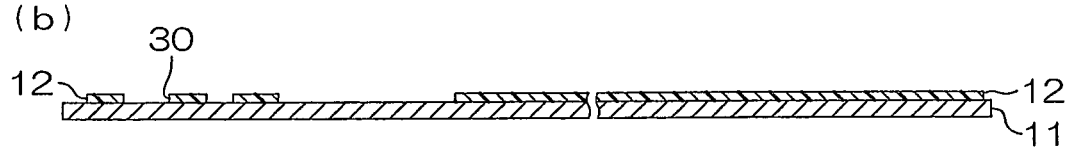
(b)
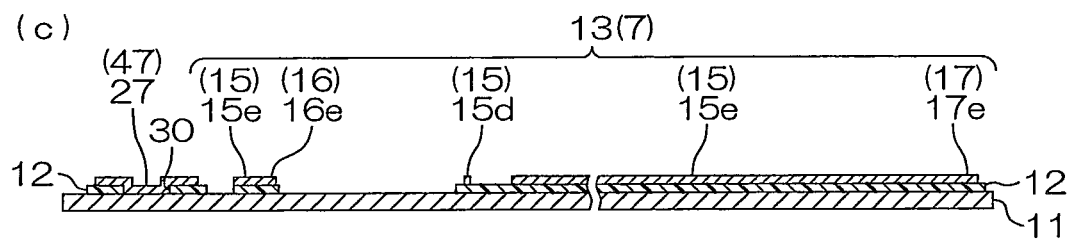
(c)
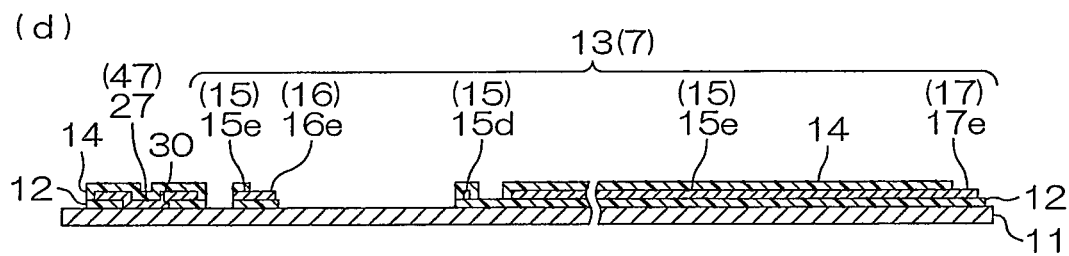
(d)
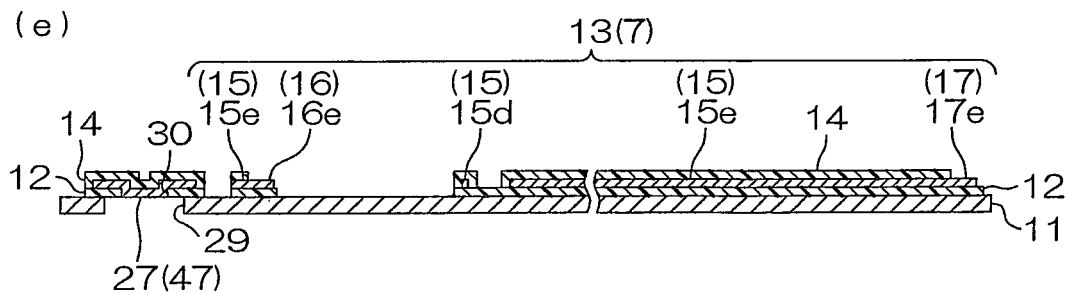
(e)
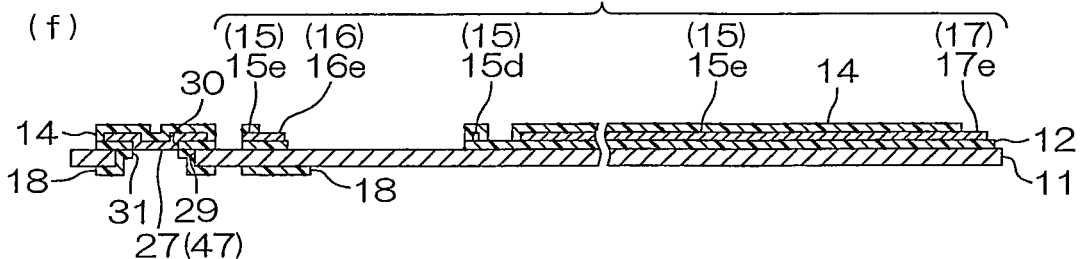
(f)

FIG. 14
(a) 
(b) 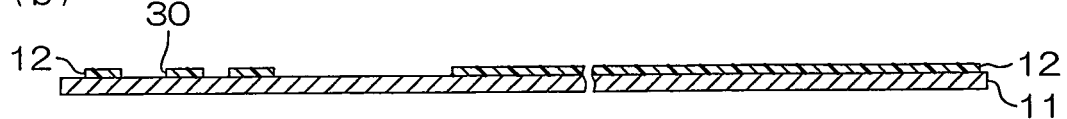
(c) 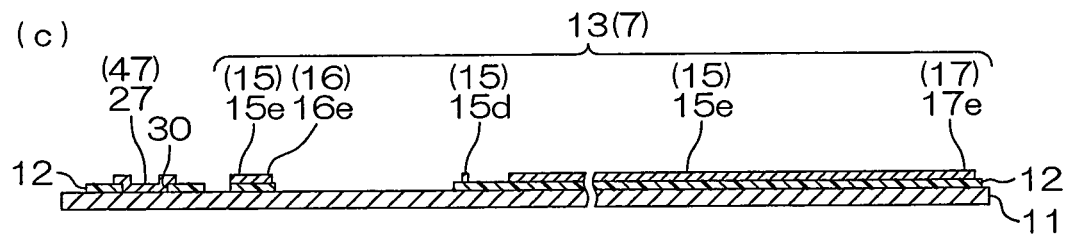
(d) 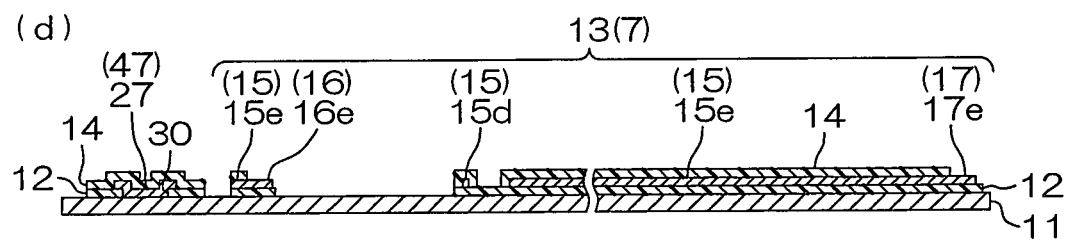
(e) 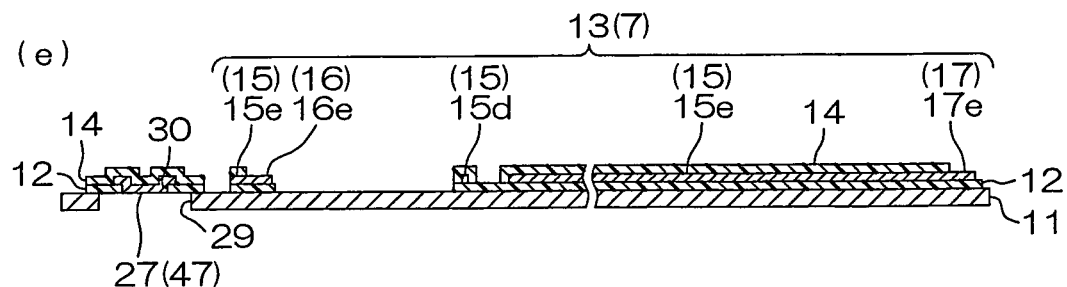
(f) 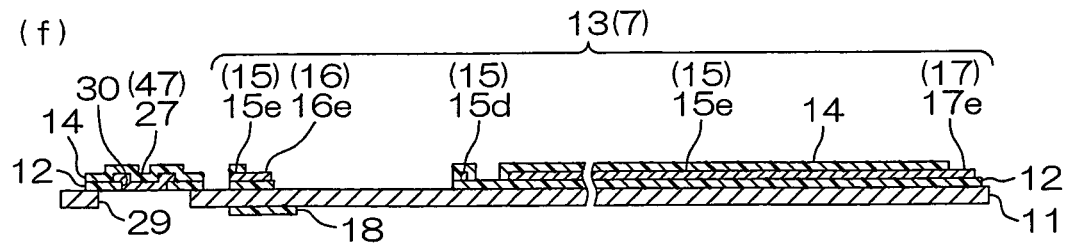

FIG. 19
(a) 
(b) 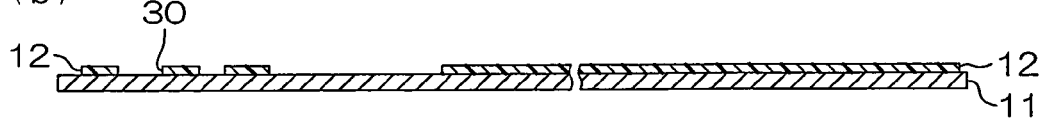
(c) 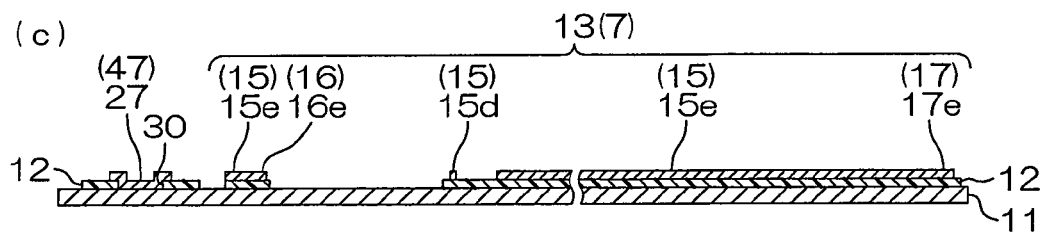
(d) 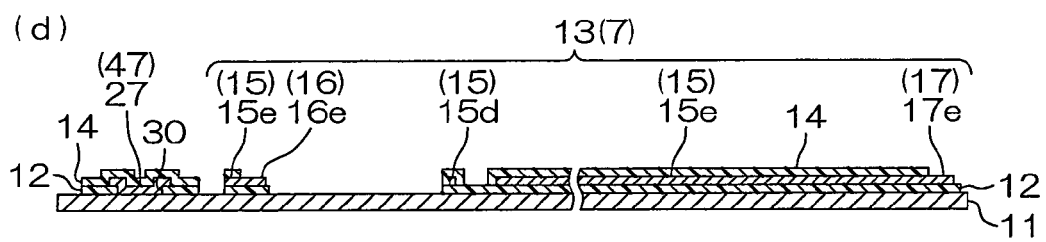
(e) 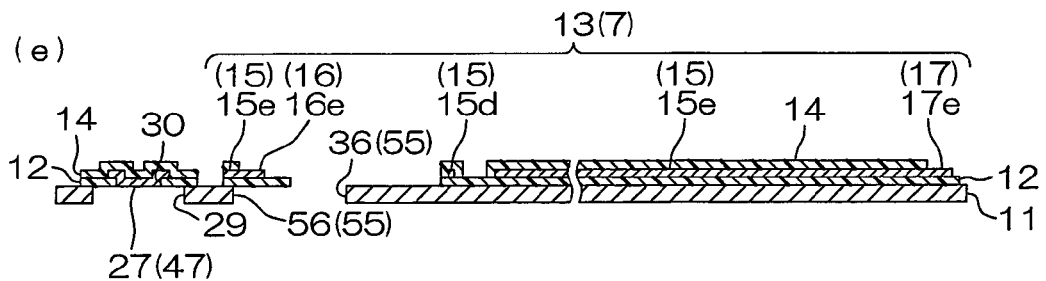
(f) 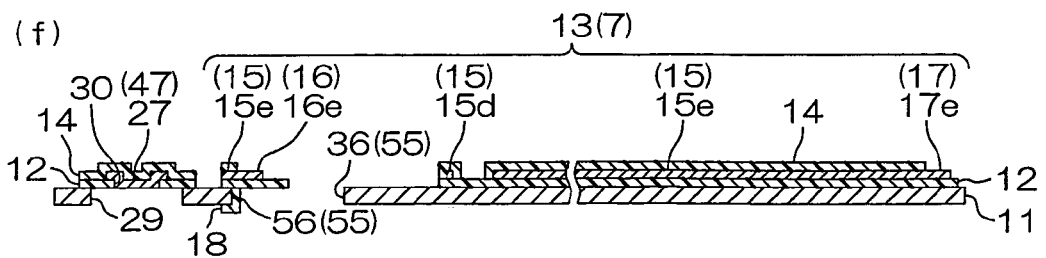

FIG. 24
(a)
(b)
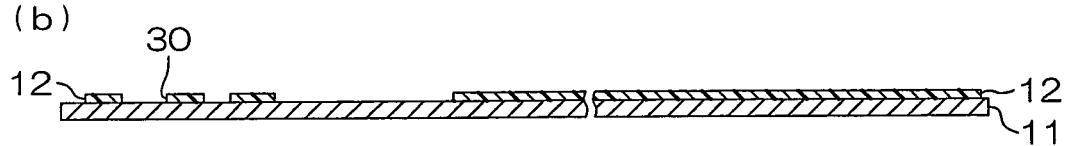
(c)
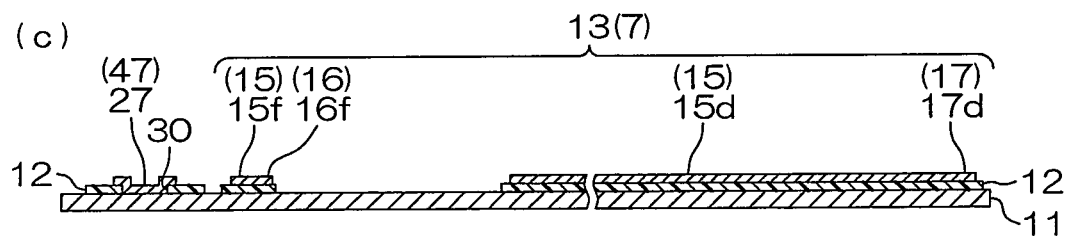
(d)
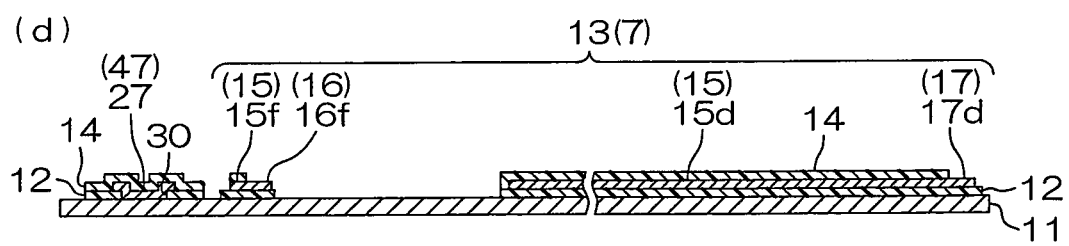
(e)
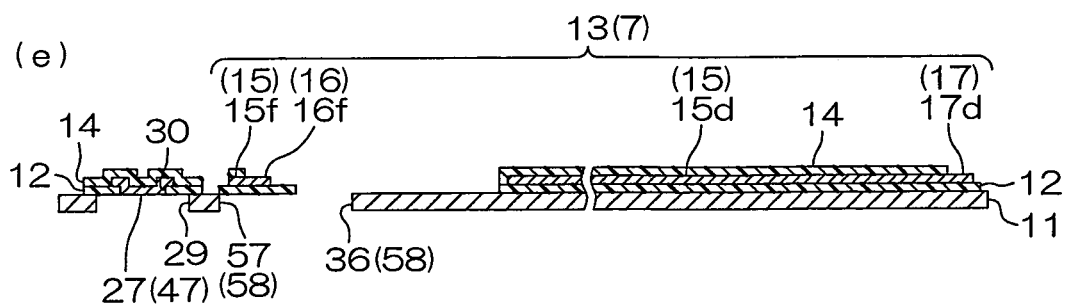

SUSPENSION BOARD WITH CIRCUIT HAVING A LIGHT EMITTING DEVICE EXPOSED FROM A SURFACE THEREOF OPPOSITE TO THAT ON WHICH A SLIDER IS MOUNTED

CROSS REFERENCE TO RELATED APPLICATIONS

This patent application claims the benefit of U.S. Provisional Application No. 61/193,272, filed on Nov. 12, 2008, and claims priority from Japanese Patent Application No. 2008-282166, filed on Oct. 31, 2008, the contents of which are herein incorporated by reference in their entirety.

BACKGROUND OF THE INVENTION

1. Field of the Invention

The present invention relates to a suspension board with circuit. More particularly, the present invention relates to a suspension board with circuit used in a hard disk drive which adopts an optical assist system.

2. Description of Related Art

In recent years, there has been known that a suspension board with circuit is used in a hard disk drive which adopts an optical assist system. The optical assist system is a recording system capable of recording information with a magnetic head in a state where a magnetic disk is heated under light irradiation from a light emitting device during recording of information, so that the coercive force of the magnetic disk is reduced. The optical assist system can record information at high density in a small recording magnetic field, and is therefore being developed at present.

In order to adopt such optical assist system, for example, a suspension board with circuit including a metal supporting board, and a light emitting device and a slider both mounted on a surface of the metal supporting board is proposed (cf. Japanese Unexamined Patent Publication No. 2008-152899). The suspension board with circuit disclosed in Japanese Unexamined Patent Publication No. 2008-152899 further includes a terminal portion (device-side terminal portion) of a supply wire electrically connected with the light emitting device, and a head-side connecting terminal portion electrically connected with the magnetic head mounted on the slider, in which the device-side terminal portion and the head-side connecting terminal portion are formed on the same surface of the metal supporting board.

SUMMARY OF THE INVENTION

However, in Japanese Unexamined Patent Publication No. 2008-152899, since both the light emitting device and the slider are mounted on the same surface of the metal supporting board, the device-side terminal portion and the head-side connecting terminal portion are formed on the same surface of the metal supporting board. Therefore, these two terminal portions are inevitably arranged densely thereon, thus easily causing a short circuit between them.

On the other hand, an attempt to prevent a short circuit from occurring requires a wider space for arrangement of the device-side terminal portion and the head-side connecting terminal portion. However, the wider space causes a problem that the suspension board with circuit cannot be compactly mounted in the hard disk drive.

In addition, since the light emitting device and the slider are mounted on the same surface of the metal supporting board, the designing of the layout is disadvantageously limited.

It is an object of the present invention to provide a suspension board with circuit capable of keeping the arrangement density of a first terminal and a second terminal low, enhancing the design flexibility of the first terminal and the second terminal, and of a slider and a light emitting device, and adopting an optical assist system.

The suspension board with circuit of the present invention is a suspension board with circuit including a conductive pattern, including a slider arranged on a surface side of the suspension board with circuit and mounted with a magnetic head, the magnetic head being electrically connected with the conductive pattern; and a light emitting device arranged on the back surface side of the suspension board with circuit and electrically connected with the conductive pattern, in which the conductive pattern includes a first terminal provided on a surface of the suspension board with circuit and electrically connected with the magnetic head; and a second terminal provided on the back surface of the suspension board with circuit and electrically connected with the light emitting device.

In the suspension board with circuit of the present invention, it is preferable that the slider includes an optical waveguide, the light emitting device is mounted on the back surface of the slider so as to be opposed to the optical waveguide in the thickness direction, and a first opening extending through the suspension board with circuiting in the thickness direction is formed so that the light emitting device is inserted therethrough.

In the suspension board with circuit of the present invention, it is preferable that the slider includes an optical waveguide, and a second opening extending through the suspension board with circuiting in the thickness direction is formed so that a light emitted from the light emitting device passes through and enters the optical waveguide.

In the suspension board with circuit of the present invention, it is preferable that the slider and the light emitting device are opposed to each other in the thickness direction.

In the suspension board with circuit of the present invention, it is preferable that the conductive pattern further includes a first wire electrically connected to the first terminal, the first wire being formed on the surface of the suspension board with circuit; and a second wire electrically connected to the second terminal, the second wire including a front-side wire formed on the surface of the suspension board with circuit; a back-side wire formed on the back surface of the suspension board with circuit; and a conductive portion allowing the front-side wire and the back-side wire to conduct in the thickness direction of the suspension board with circuit.

In the suspension board with circuit of the present invention, it is preferable that the conductive portion is provided on one end portion where the magnetic head on the suspension board with circuit is mounted.

In the suspension board with circuit of the present invention, it is preferable that the conductive portion includes a front-side conductive portion formed continuously with the front-side wire; and a back-side conductive portion formed continuously with the back-side wire, the front-side conductive portion and the back-side conductive portion being electrically connected with each other.

It is preferable that the suspension board with circuit of the present invention further includes a first insulating layer formed under the front-side wire; a metal supporting board formed under the first insulating layer; and a second insulating layer formed under the metal supporting board and on the back-side wire, in which the metal supporting board has a first metal opening formed extending therethrough in the thickness direction, the first insulating layer covers the peripheral end edge of the first metal opening so as to have a first center opening formed extending through the first insulating layer in the thickness direction at the center of the first metal opening, the first center opening being filled with the front-side conductive portion, the second insulating layer covers the peripheral end edge of the first metal opening so as to have a second center opening formed in opposed relation to the first center opening in the thickness direction and extending through the second insulating layer in the thickness direction, the second center opening being filled with the back-side conductive portion, and the front-side conductive portion and the back-side conductive portion are in direct contact with each other in an opposed portion between the first center opening and the second center opening.

It is preferable that the suspension board with circuit of the present invention further includes a first insulating layer formed under the front-side wire; a metal supporting board formed under the first insulating layer; and a second insulating layer formed under the metal supporting board and on the back-side wire, in which the metal supporting board has an annular opening formed in an annular shape extending therethrough in the thickness direction, the conductive portion further comprises an insulated conductive portion arranged within the annular opening and insulated from the metal supporting board around the annular opening, the first insulating layer covers the annular opening and has a first insulating opening formed exposing the insulated conductive portion, the first insulating opening being filled with the front-side conductive portion, the second insulating layer covers the peripheral end edge of the annular opening and has a second insulating opening formed exposing the insulated conductive portion, the second insulating opening being filled with the back-side conductive portion, and the front-side conductive portion and the back-side conductive portion are electrically connected with each other through the insulated conductive portion.

It is preferable that the suspension board with circuit of the present invention further includes a first insulating layer formed under the front-side wire; and a metal supporting board formed under the first insulating layer, in which the metal supporting board has a first metal opening formed extending therethrough in the thickness direction, the first insulating layer covers the peripheral end edge of the first metal opening so as to form a first center opening extending through the first insulating layer in the thickness direction at the center of the first metal opening, the first center opening being filled with the front-side conductive portion, the back-side conductive portion is arranged within the first metal opening in opposed relation to the first center opening, and the front-side conductive portion and the back-side conductive portion are in direct contact with each other in the first center opening.

In the suspension board with circuit of the present invention, it is preferable that the second terminal is formed directly on the back surface of the first insulating layer.

In the suspension board with circuit of the present invention, it is preferable that the second terminal and the second wire are formed directly on the back surface of the first insulating layer.

In the suspension board with circuit of the present invention, the first terminal and the second terminal are formed on the surface and the back surface of the suspension board with circuit, respectively.

Therefore, design flexibility of the layout of the first and second terminals can be enhanced, and each of the terminals can be formed at an arrangement density which may not cause a short circuit.

As a result, the suspension board with circuit can be made compact and the connection reliability of the first terminal and the second terminal can be improved.

Further, in the suspension board with circuit, the slider and the light emitting device are arranged on the surface side and back surface side of the suspension board with circuit, respectively.

Therefore, the magnetic head and the light emitting device are electrically connected to the first terminal and the second terminal, respectively, both terminals having enhanced design flexibility of the layout, whereby design flexibility of the layout of the slider and the light emitting device can be enhanced.

BRIEF DESCRIPTION OF THE DRAWINGS

FIG. 5 is a process diagram explaining a method for producing the suspension board with circuit shown in FIG. 3, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, (e) showing the step of forming a first metal opening in the metal supporting board, and (f) showing the step of forming a second insulating base layer;

FIG. 14 is a process diagram explaining a method for producing the suspension board with circuit shown in FIG. 12, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, (e) showing the step of forming a first opening in the metal supporting board, and (f) showing the step of forming a second insulating base layer;

FIG. 19 is a process diagram explaining a method for producing the suspension board with circuit shown in FIG. 18, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, (e) showing the step of forming a first metal opening and a third opening in the metal supporting board, and (f) showing the step of forming a second insulating base layer;

FIG. 24 is a process diagram explaining a method for producing the suspension board with circuit shown in FIG. 23, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, and (e) showing the step of forming a first metal opening and a fourth opening in the metal supporting board;

DETAILED DESCRIPTION OF PREFERRED EMBODIMENTS

Figure 1:
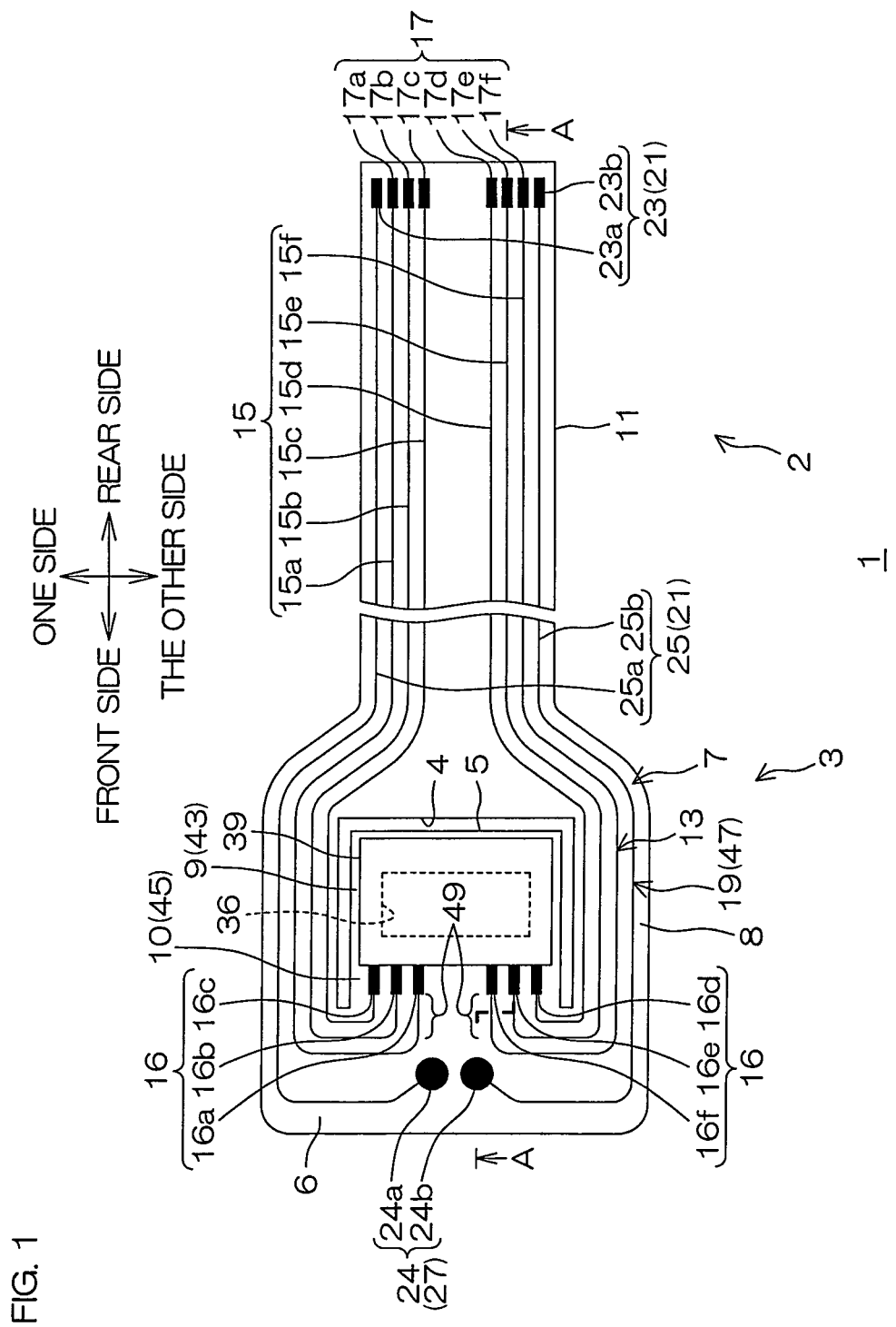
FIG. 1 is a plan view illustrating a suspension board with circuit of an embodiment according to the present invention.
Figure 2:
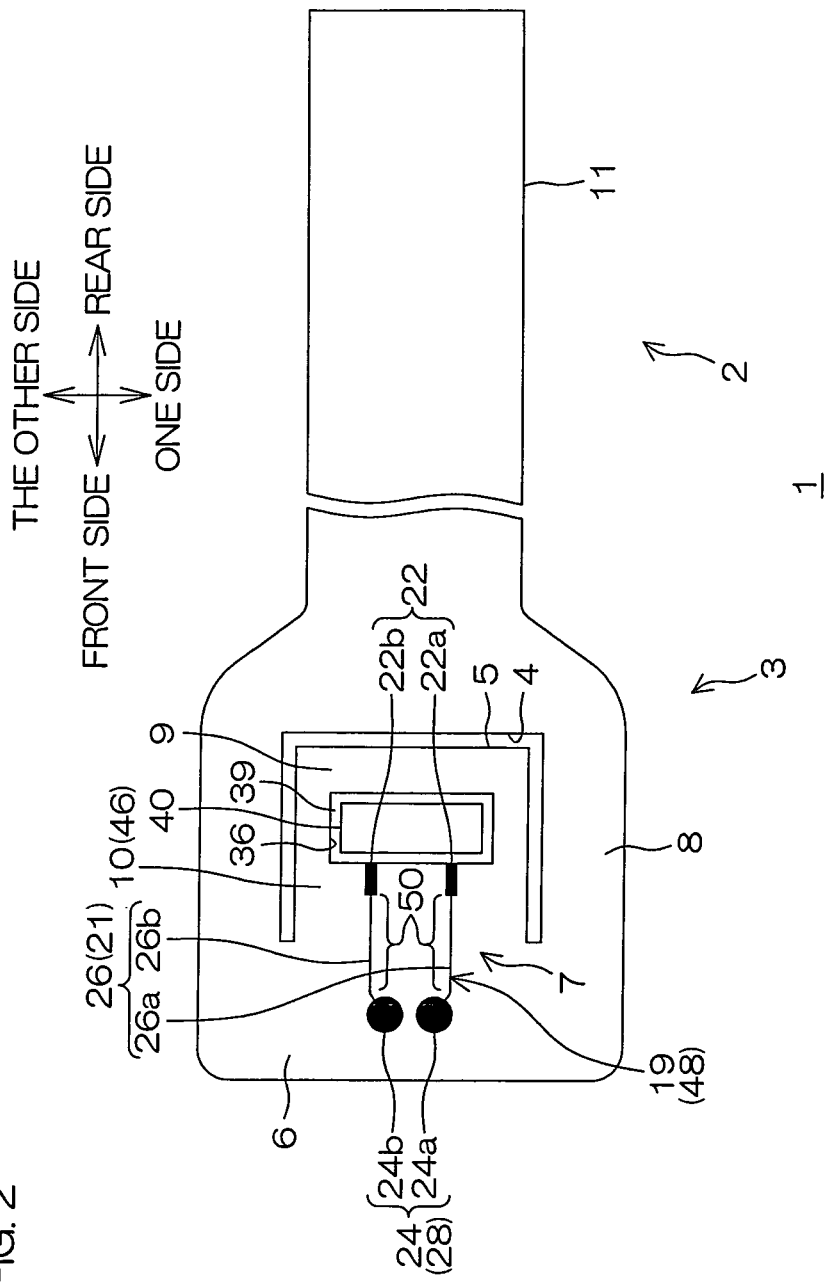
FIG. 2 is a bottom view of the suspension board with circuit shown in FIG. 1.
Figure 3:
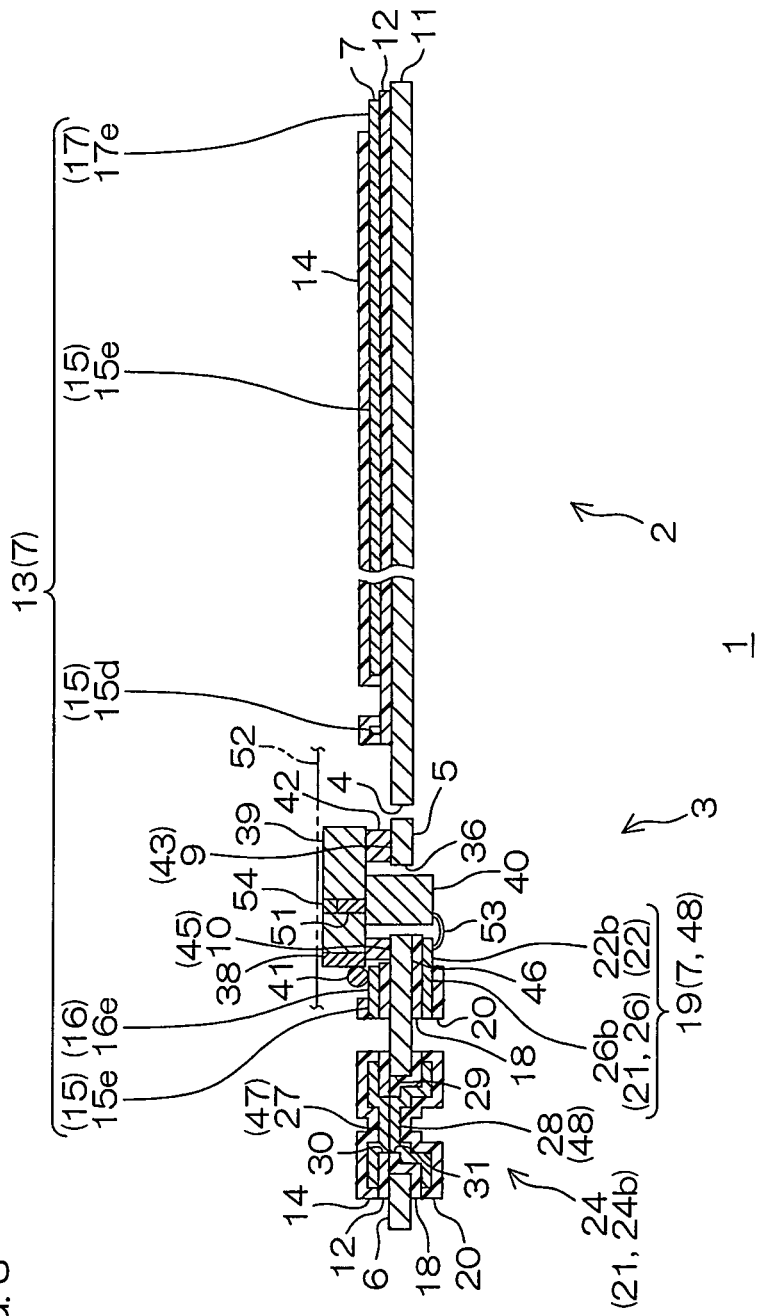
FIG. 3 is a sectional view of the suspension board with circuit taken along the line A-A shown in FIG. 1.
Figure 4:
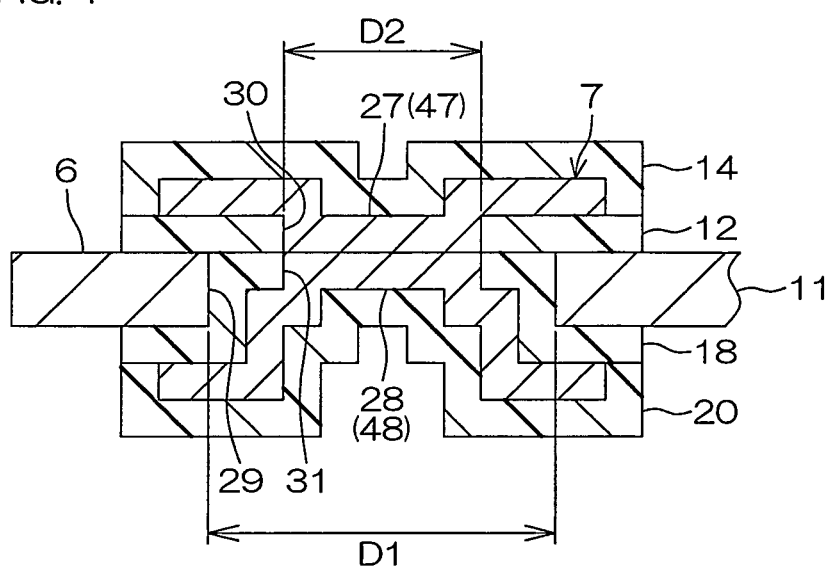
FIG. 4 is an enlarged sectional view of a conductive portion shown in FIG. 3.
Figure 6:
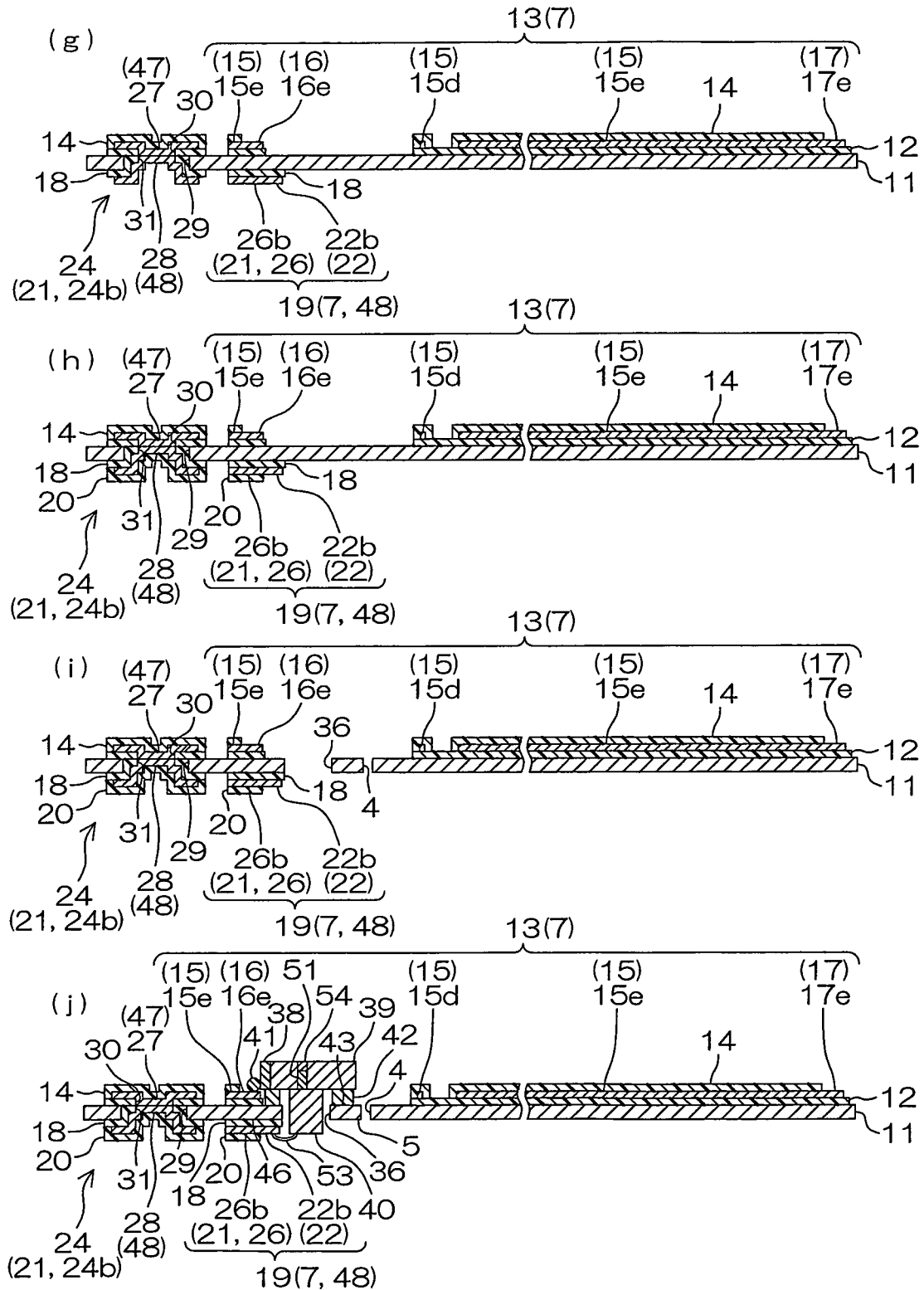
FIG. 6 is a process diagram explaining the method for producing the suspension board with circuit shown in FIG. 3, subsequent to FIG. 5, (g) showing the step of forming a back-side second conductive pattern, (h) showing the step of forming a second insulating cover layer, (i) showing the step of forming a slit portion and a first opening in the metal supporting board, and (j) showing the step of mounting a slider.

FIG. 1 is a plan view illustrating a suspension board with circuit of an embodiment according to the present invention; FIG. 2 is a bottom view of the suspension board with circuit shown in FIG. 1; FIG. 3 is a sectional view of the suspension board with circuit taken along the line A-A shown in FIG. 1; FIG. 4 is an enlarged sectional view of a conductive portion shown in FIG. 3; and FIGS. 5 and 6 is process diagrams explaining a method for producing the suspension board with circuit shown in FIG. 3.

To clearly illustrate a relative position of a conductive pattern 7 to be described later, a first insulating base layer 12 and a first insulating cover layer 14, both described later, are omitted in FIG. 1. In addition, to clearly illustrate a relative position of the conductive pattern 7 to be described later, a second insulating base layer 18 and a second insulating cover layer 20, both described later, are omitted in FIG. 2.

In FIGS. 1 to 3, the suspension board with circuit 1 is mounted with a slider 39 having a magnetic head 38 mounted thereon, and a light emitting device 40, and is used in a hard disk drive which adopts an optical assist system.

The suspension board with circuit 1 has a conductive pattern 7 supported on a metal supporting board 11.

The metal supporting board 11 is formed in the shape of a flat band extending in a lengthwise direction thereof, integrally including a wire portion 2 arranged on the other side in the lengthwise direction (hereinafter referred to as the rear end side), and a mounting portion 3 arranged on one side in the lengthwise direction (hereinafter referred to as the front end side) of the wire portion 2.

The wire portion 2 is formed in a generally rectangular shape in plane view extending in the lengthwise direction. The wire portion 2 is formed as a region supported by mounting its back surface (under surface) on a load beam, which is not shown.

When the wire portion 2 is mounted on the load beam, the mounting portion 3 is not mounted on the load beam and is formed as a region having its back surface (under surface) exposed from the load beam. Specifically, the mounting portion 3 is formed as lengthwise one end portion (front end portion) mounted with the slider 39 (having the magnetic head 38 and the light emitting device 40 mounted thereon) in the suspension board with circuit 1. The mounting portion 3 is, specifically, formed continuously from the front end of the wire portion 2, having a generally rectangular shape in plane view expanding toward both outer sides of the wire portion 2 in the widthwise direction (a direction perpendicular to the lengthwise direction).

The mounting portion 3 also has a slit portion 4 formed in a generally U-shape opening toward the front end side in plane view. Further, the mounting portion 3 is divided into a gimbal portion 5 sandwiched by the slit portion 4 in the widthwise direction, an outrigger portion 8 arranged on both the widthwise outer sides of the slit portion 4, and a wire turning portion 6 arranged on the front end side of the gimbal portion 5 and the outrigger portion 8.

The gimbal portion 5 has a portion capable of providing flexibility in the operation of the slider 39, is arranged in the widthwise center and the middle of the front-to-rear direction of the mounting portion 3, and is formed in a generally rectangular shape in plane view. The gimbal portion 5 includes a mounting region 9 and a terminal forming portion 10.

The mounting region 9 is a region for arranging the slider 39 and the light emitting device 40 to be mounted thereon, being arranged on the rear end side of the gimbal portion 5 and formed in a generally rectangular shape longer in the lengthwise direction as viewed in plane.

The surface (upper surface) of the mounting region 9 is defined as a slider mounting region 43 where the slider 39 (having the light emitting device 40 mounted thereon), to be described later, is mounted.

The mounting region 9 also has an insertion opening 36 as a first opening extending through the suspension board with circuit 1 in the thickness direction.

The insertion opening 36 is open smaller than the slider 39 (mounting region 9) and larger than the light emitting device 40 as viewed in plane, and is formed in a generally rectangular shape longer in the widthwise direction as viewed in plane. More specifically, the insertion opening 36 is formed in the lengthwise center of and the widthwise center of the mounting region 9, with the light emitting device 40 being inserted therethrough.

The terminal forming portion 10 is a region in which a head-side terminal 16 and a device-side terminal 22, both described later, are formed, and is arranged on the front end side of the mounting region 9. The terminal forming portion 10 is formed so as to extend in the widthwise direction.

The surface (upper surface) of the terminal forming portion 10 is defined as a head-side terminal forming portion 45 where the head-side terminal 16 is formed while the back surface (under surface) of the terminal forming portion 10 is defined as a device-side terminal forming portion 46 where the device-side terminal 22 is formed. As shown in FIG. 3, the head-side terminal forming portion 45 is positioned slightly rearward of the device-side terminal forming portion 46.

The conductive pattern 7 includes a first conductive pattern 13 and a second conductive pattern 19.

As shown in FIGS. 1 and 3, the first conductive pattern 13 is formed on the surface of the metal supporting board 11. The first conductive pattern 13 integrally includes a head-side terminal 16 serving as a first terminal, an external terminal 17, and a signal wire 15 serving as a first wire for connecting the head-side terminal 16 and the external terminal 17.

A plurality (six pieces) of signal wires 15 are provided along the lengthwise direction of the suspension board with circuit 1, each signal wire 15 arranged in parallel spaced relation to each other in the widthwise direction.

The plurality of signal wires 15 are formed with a first signal wire 15a, a second signal wire 15b, a third signal wire 15c, a fourth signal wire 15d, a fifth signal wire 15e, and a sixth signal wire 15f. The first signal wire 15a, the second signal wire 15b, the third signal wire 15c, the fourth signal wire 15d, the fifth signal wire 15e, and the sixth signal wire 15f are sequentially arranged from one side in the widthwise direction toward the other side in the widthwise direction.

In the mounting portion 3, the first signal wire 15a, the second signal wire 15b, and the third signal wire 15c are arranged over the outrigger portion 8 on one side in the widthwise direction and are formed along the outrigger portion 8. The fourth signal wire 15d, the fifth signal wire 15e, and the sixth signal wire 15f are arranged over the outrigger portion 8 on the other side in the widthwise direction so as to lie along the outrigger portion 8.

In the wire turning portion 6, the first signal wire 15a, the second signal wire 15b, the third signal wire 15c, the fourth signal wire 15d, the fifth signal wire 15e, and the sixth signal wire 15f are arranged to turn back, and finally to reach the head-side terminal forming portion 45. Specifically, each of the signal wires 15 is arranged in the following manner. Each signal wire 15 reaches both the widthwise outer portions of the wire turning portion 6 from the front end of the outrigger portion 8, and then extends toward the widthwise inner side of the wire turning portion 6. Subsequently, it further turns back toward the rear end side, extends from the rear end of the wire turning portion 6 toward the rear end side, and finally reaches the front end portion of the head-side terminal 16 in the head-side terminal forming portion 45.

Of the signal wires 15, the first signal wire 15a and the sixth signal wire 15f, each lying on the outermost side, are formed at a spaced interval to the outer end edge of the metal supporting board 11 so that front-side power supply wires 25 to be described later are formed in such space.

In the signal wires 15, a portion extending toward the head-side terminal forming portion 45 from the wire turning portion 6 is defined as a linear front-side straight-line portion 49 along the lengthwise direction.

A plurality (six pieces) of external terminals 17 are provided in the rear end portion of the surface of the wire portion 2, each arranged to be connected with the rear end portion of each of the signal wires 15. Further, the external terminals 17 are spaced apart from each other in the widthwise direction. Of the external terminals 17, a first external terminal 17a, a second external terminal 17b, a third external terminal 17c, a fourth external terminal 17d, a fifth external terminal 17e, and a sixth external terminal 17f, which are connected corresponding to the first signal wire 15a, the second signal wire 15b, the third signal wire 15c, the fourth signal wire 15d, the fifth signal wire 15e, and the sixth signal wire 15f, respectively, are sequentially arranged from one side in the widthwise direction toward the other side in the widthwise direction. The external terminals 17 are connected to an external circuit board such as a read/write board, which is not shown.

The head-side terminal 16 is arranged on the surface of the mounting portion 3. More specifically, it is arranged on the head-side terminal forming portion 45 of the gimbal portion 5. A plurality (six pieces) of head-side terminals 16 are provided, each connected with the front end portion of each of the signal wires 15.

More specifically, the head-side terminals 16 are spaced apart from each other in the widthwise direction along the rear end edge (the front end edge of the slider mounting region 43) of the head-side terminal forming portion 45.

The plurality of head-side terminals 16 are formed with a first head-side terminal 16a, a second head-side terminal 16b, a third head-side terminal 16c, a fourth head-side terminal 16d, a fifth head-side terminal 16e, and a sixth head-side terminal 16f. Of the head-side terminals 16, the third head-side terminal 16c, the second head-side terminal 16b, the first head-side terminal 16a, the sixth head-side terminal 16f, the fifth head-side terminal 16e, and the fourth head-side terminal 16d, which are connected corresponding to the third signal wire 15c, the second signal wire 15b, the first signal wire 15a, the sixth signal wire 15f, the fifth signal wire 15e, and the fourth signal wire 15d, respectively, are sequentially arranged from one side in the widthwise direction toward the other side in the widthwise direction.

The head-side terminals 16 are electrically connected with the magnetic head 38 via solder balls 41.

In the first conductive pattern 13, a write signal transmitted from an external circuit board is input to the magnetic head 38 of the slider 39 through the external terminals 17, the signal wires 15, and the head-side terminals 16, while a read signal read by the magnetic head 38 is input to the external circuit board through the head-side terminals 16, the signal wires 15, and the external terminals 17.

The second conductive pattern 19 includes a supply-side terminal 23 (FIG. 1), a device-side terminal 22 (FIG. 2) serving as a second terminal, and a power supply wire 21 (FIGS. 1 and 2) serving as a second wire for connecting the supply-side terminal 23 and the device-side terminal 22.

The power supply wire 21 is provided on both the front and back sides of the suspension board with circuit 1, and specifically, includes a front-side power supply wire 25 (FIG. 1) serving as a front-side wire, a back-side power supply wire 26 (FIG. 2) serving as a back-side wire, and a conductive portion 24 (FIGS. 1 and 2) which allows the front-side power supply wire 25 and the back-side power supply wire 26 to conduct in the thickness direction of the suspension board with circuit 1.

As shown in FIG. 1, the front-side power supply wire 25 is provided on the surface of the suspension board with circuit 1, specifically, on the surface of the metal supporting board 11. A plurality (two pieces) of front-side power supply wires 25 are provided over the wire portion 2 and the mounting portion 3 along the lengthwise direction, each wire 25 arranged in parallel spaced relation to each other in the widthwise direction. Further, the front end and the rear end of the front-side power supply wire 25 are formed continuously with the conductive portion 24 and the supply-side terminal 23, respectively.

The plurality of front-side power supply wires 25 are formed with a first front-side power supply wire 25a and a second front-side power supply wire 25b. The first front-side power supply wire 25a and the second front-side power supply wire 25b are arranged on one side and on the other side, respectively, in the widthwise direction.

The first front-side power supply wire 25a and the second front-side power supply wire 25b are spaced apart from each other in the widthwise direction so that the signal wires 15 are formed in such space.

Specifically, the first front-side power supply wire 25a is arranged on one side (outer side) in the widthwise direction of the first signal wire 15a, while the second front-side power supply wire 25b is arranged on the other side (outer side) in the widthwise direction of the sixth signal wire 15f.

In other words, the first front-side power supply wire 25a is spaced apart from the first signal wire 15a on one side in the widthwise direction in the outrigger portion 8, and is spaced apart from the first signal wire 15a on the front end side in the wire turning portion 6.

On the other hand, the second front-side power supply wire 25b is spaced apart from the sixth signal wire 15f on the other side in the widthwise direction in the outrigger portion 8, and is spaced apart from the sixth signal wire 15f on the front end side in the wire turning portion 6.

Specifically, the first front-side power supply wire 25a is arranged in the following manner. In the outrigger portion 8, the first front-side power supply wire 25a extends along the first signal wire 15a, and then reaches one of the widthwise end portions of the wire turning portion 6. Subsequently, in the wire turning portion 6, it extends toward the other side (inner side) in the widthwise direction and finally reaches the conductive portion 24.

On the other hand, the second front-side power supply wire 25b is arranged in the following manner. In the outrigger portion 8, the second front-side power supply wire 25b extends along the sixth signal wire 15f, and then reaches the widthwise other end portion of the wire turning portion 6. Subsequently, in the wire turning portion 6, it extends toward one side (inner side) in the widthwise direction and finally reaches the conductive portion 24.

As shown in FIGS. 2 and 3, the back-side power supply wire 26 is provided on the back surface of the suspension board with circuit 1, specifically, on the back surface of the metal supporting board 11. The back-side power supply wire 26 is provided corresponding to the front-side power supply wire 25 and, specifically, is formed on (the back surface of) the wire turning portion 6 and the device-side terminal forming portion 46. A plurality (two pieces) of back-side power supply wires 26 are provided along the lengthwise direction, each wire 26 arranged in parallel spaced relation to each other in the widthwise direction.

The plurality of the back-side power supply wires 26 are formed with a first back-side power supply wire 26a and a second back-side power supply wire 26*b*. The first back-side power supply wire 26*a* and the second back-side power supply wire 26*b* are arranged on one side and on the other side, respectively, in the widthwise direction.

The front end portion and the rear end portion of the back-side power supply wire 26 are formed continuously with the conductive portion 24 and the device-side terminal 22, respectively.

The back-side power supply wire 26 is opposed to the signal wires 15 (second signal wire 15*b* and fifth signal wire 15*e*; see FIG. 1.) in the thickness direction.

In the back-side power supply wire 26, a portion extending toward the device-side terminal forming portion 46 from the wire turning portion 6 is defined as a linear back-side straight-line portion 50 along the lengthwise direction, the back-side straight-line portion 50 being opposed to the above-mentioned front-side straight-line portion 49 in the thickness direction.

Although the layer construction of the conductive portion 24 will be described in detail hereinafter, the conductive portion 24 includes a front-side conductive portion 27 formed continuously with the front-side power supply wire 25 and a back-side conductive portion 28 formed continuously with the back-side power supply wire 26, as shown in FIGS. 1, 2, and 4. The front-side conductive portion 27 and the back-side conductive portion 28 are electrically connected with each other.

In the power supply wires 21, the front-side power supply wire 25 and the back-side power supply wire 26 are electrically connected with each other through the conductive portion 24 (front-side conductive portion 27 and back-side conductive portion 28). More specifically, the first front-side power supply wire 25*a* and the first back-side power supply wire 26*a* are electrically connected with each other through the conductive portion 24 (first conductive portion 24*a* to be described later), the second front-side power supply wire 25*b* and the second back-side power supply wire 26*b* are electrically connected with each other through the conductive portion 24 (second conductive portion 24*b* to be described later).

The supply-side terminal 23 is provided on the surface of the suspension board with circuit 1, specifically, on the surface of the metal supporting board 11. Further, the supply-side terminal 23 is arranged in the rear end portion of the wire portion 2 and a plurality (two pieces) of supply-side terminals 23 are provided, each connected with the rear end portion of the front-side power supply wire 25. The supply-side terminal 23 is formed with a first supply-side terminal 23*a* and a second supply-side terminal 23*b*, which are connected corresponding to the first front-side power supply wire 25*a* and the second front-side power supply wire 25*b*, respectively. The first supply-side terminal 23*a* and the second supply-side terminal 23*b* are arranged on one side and on the other side, respectively, in the widthwise direction.

The first supply-side terminal 23*a* and the second supply-side terminal 23*b* are spaced apart from each other in the widthwise direction so that the external terminals 17 are formed in such space.

The supply-side terminals 23 are formed so as to be arranged in the same position as the external terminals 17 when projected in the widthwise direction. A power source, which is not shown, is connected to the supply-side terminal 23.

The device-side terminal 22 is provided on the back surface of the suspension board with circuit 1, specifically, on the back surface of the metal supporting board 11. The device-side terminal 22 is also arranged on the back surface of the mounting portion 3. More specifically, it is arranged in the device-side terminal forming portion 46 of the gimbal portion 5. A plurality (two pieces) of device-side terminals 22 are provided, each connected with the rear end portion of each of the back-side power supply wires 26.

The device-side terminals 22 are spaced apart from each other in the widthwise direction along the rear end edge (the front end edge of the insertion opening 36 in the metal supporting board 11) of the device-side terminal forming portion 46. The device-side terminals 22 are formed with a first device-side terminal 22*a* and a second device-side terminal 22*b*, which are connected corresponding to the first back-side power supply wire 26*a* and the second back-side power supply wire 26*b*, respectively. The first device-side terminal 22*a* and the second device-side terminal 22*b* are arranged on one side and on the other side, respectively, in the widthwise direction.

The device-side terminals 22 are opposed to the head-side terminals 16. More specifically, the first device-side terminal 22*a* and the second device-side terminal 22*b* are opposed to the second head-side terminal 16*b* and to the fifth head-side terminal 16*e*, respectively. The device-side terminals 22 are positioned slightly rearward of the head-side terminals 16 when projected in the thickness direction.

As shown in FIG. 3, a terminal of the back-side portion (lower end portion) of the light emitting device 40 is electrically connected to each of the device-side terminals 22 through a wire 53.

In the second conductive pattern 19, electrical energy supplied from a power source is supplied to the light emitting device 40 through the supply-side terminals 23, the power supply wires 21, and the device-side terminals 22, thereby emitting high-energy light from the light emitting device 40.

In the second conductive pattern 19, the supply-side terminals 23, the front-side power supply wires 25, and the front-side conductive portion 27, all shown in FIG. 1, are provided on the front side of the suspension board with circuit 1, so that they are defined as a front-side second conductive pattern 47, while the device-side terminals 22, the back-side power supply wires 26, and the back-side conductive portion 28, all shown in FIG. 2, are provided on the back side of the suspension board with circuit 1, so that they are defined as a back-side second conductive pattern 48.

As shown in FIG. 3, the suspension board with circuit 1 includes the metal supporting board 11, a first insulating base layer 12 serving as a first insulating layer formed on the surface of the metal supporting board 11, the first conductive pattern 13 and the front-side second conductive pattern 47 both formed on the surface of the first insulating base layer 12, and a first insulating cover layer 14 formed on the surface of the first insulating base layer 12 so as to cover the first conductive pattern 13 and the front-side second conductive pattern 47.

The suspension board with circuit 1 also includes a second insulating base layer 18 serving as a second insulating layer formed on the back surface of the metal supporting board 11, the back-side second conductive pattern 48 formed on the back surface of the second insulating base layer 18, and a second insulating cover layer 20 formed on the back surface of the second insulating base layer 18 so as to cover the back-side second conductive pattern 48.

Further, the suspension board with circuit 1 includes the slider 39 arranged on the surface side (upper side) of the metal supporting board 11, and the light emitting device 40 arranged on the back surface side (under side) of the metal supporting board 11.

The metal supporting board 11 is formed of a conductive material, and specifically, of a metal material such as stainless steel, 42-alloy, aluminum, copper-beryllium, or phosphor bronze. The metal supporting board 11 is preferably formed of stainless steel. The metal supporting board 11 has a thickness in the range of, for example, 15 to 50 μm, or preferably 20 to 30 μm. The insertion opening 36 has a length (length in lengthwise direction) in the range of, for example, 200 to 500 μm, and a width (length in widthwise direction) in the range of, for example, 300 to 700 μm.

The first insulating base layer 12 is formed so that the peripheral end edge of the surface of the metal supporting board 11 is exposed, corresponding to portions in which the first conductive pattern 13 and the front-side second conductive pattern 47 in the wire portion 2 and the mounting portion 3 are formed.

The first insulating base layer 12 is formed of an insulating material such as synthetic resin, for example, polyimide resin, polyamide imide resin, acrylic resin, polyether nitrile resin, polyether sulfone resin, polyethylene terephthalate resin, polyethylene naphthalate resin, polyvinyl chloride resin, or the like. The first insulating base layer 12 is preferably formed of polyimide resin.

The first insulating base layer 12 has a thickness in the range of, for example, 1 to 35 μm, or preferably 8 to 15 μm.

The first conductive pattern 13 and the front-side second conductive pattern 47 are arranged over the wire portion 2 and the mounting portion 3 as described above.

The first conductive pattern 13 and the front-side second conductive pattern 47 are formed of a conductive material such as copper, nickel, gold, solder, or alloys thereof. These patterns are preferably formed of copper.

The first conductive pattern 13 and the front-side second conductive pattern 47 each have a thickness in the range of, for example, 3 to 50 μm, or preferably 5 to 20 μm.

The signal wires 15 and the front-side power supply wires 25 each have a width in the range of, for example, 10 to 200 μm, or preferably 20 to 100 μm. A spacing between each of the signal wires 15 is in the range of, for example, 10 to 1000 μm, or preferably 20 to 100 μm. A spacing between each of the front-side power supply wires 25 is in the range of, for example, 50 to 10000 μm, or preferably 100 to 1000 μm. Each of the spacings between the signal wires 15 and the front-side power supply wires 25 (a spacing between the first signal wire 15a and the first front-side power supply wire 25a, and a spacing between the sixth signal wire 15f and the second front-side power supply wire 25b) is in the range of, for example, 10 to 1000 μm, or preferably 20 to 100 μm.

The head-side terminals 16, the external terminals 17, the supply-side terminals 23, and the front-side conductive portion 27 each have a width in the range of, for example, 20 to 1000 μm, or preferably 30 to 800 μm. A spacing between each of the head-side terminals 16, a spacing between each of the external terminals 17, and a spacing of the front-side conductive portion 27 each are in the range of, for example, 20 to 1000 μm, or preferably 30 to 800 μm. A spacing between each of the supply-side terminals 23 are in the range of, for example, 50 to 10000 μm, or preferably 100 to 1000 μm.

The first insulating cover layer 14 is arranged over the wire portion 2 and the mounting portion 3 so as to correspond to portions in which the first conductive pattern 13 and the front-side second conductive pattern 47 are formed. Specifically, the first insulating cover layer 14 is formed in a pattern which exposes the external terminals 17 and the head-side terminals 16 and covers the signal wires 15, corresponding to the first conductive pattern 13. Further, the first insulating cover layer 14 is formed in a pattern which exposes the supply-side terminals 23 and covers the front-side power supply wires 25 and the front-side conductive portion 27, corresponding to the front-side second conductive pattern 47.

The first insulating cover layer 14 is formed of the same insulating material as the above-mentioned first insulating base layer 12. The first insulating cover layer 14 has a thickness in the range of, for example, 1 to 40 μm, or preferably, 1 to 10 μm.

The second insulating base layer 18 is provided on the back surface (under surface) of the mounting portion 3, and more particularly, is formed corresponding to a portion in which the back-side second conductive pattern 48 in the wire turning portion 6 and the device-side terminal forming portion 46 is formed.

The second insulating base layer 18 is formed of the same insulating material as the above-mentioned first insulating base layer 12. The second insulating base layer 18 has a thickness in the range of, for example, 1 to 35 μm, or preferably, 8 to 15 μm.

The back-side second conductive pattern 48 is arranged in the mounting portion 3 as described above.

The back-side second conductive pattern 48 is formed of the same conductive material as the front-side second conductive pattern 47. The back-side second conductive pattern 48 has a thickness in the range of, for example, 3 to 50 μm, or preferably 5 to 20 μm.

Each of the back-side power supply wires 26 has a width in the range of, for example, 10 to 200 μm, or preferably 20 to 100 μm, and a spacing between each of the back-side power supply wires 26 is in the range of, for example, 20 to 1000 μm, or preferably 30 to 800 μm.

The device-side terminals 22 and the back-side conductive portion 28 each have a width in the range of, for example, 20 to 1000 μm, or preferably 30 to 800 μm. A spacing between each of the device-side terminals 22 and a spacing of the back-side conductive portion 28 each are in the range of, for example, 20 to 1000 μm, or preferably 30 to 800 μm.

The second insulating cover layer 20 is arranged in the mounting portion 3 so as to correspond to a portion in which the back-side second conductive pattern 48 is formed. Specifically, the second insulating cover layer 20 is formed in a pattern which exposes the device-side terminals 22 and covers the back-side power supply wires 26 and the back-side conductive portion 28.

The second insulating cover layer 20 is formed of the same insulating material as the above-mentioned first insulating base layer 12. The second insulating cover layer 20 has a thickness in the range of, for example, 1 to 40 μm, or preferably, 1 to 10 μm.

The slider 39 is arranged in the slider mounting region 43 so as to float with a minute space between the slider 39 and a magnetic disk 52 (see the phantom line in FIG. 3) while traveling relatively to the magnetic disk 52. Specifically, in the slider mounting region 43, the slider 39 is provided via an adhesive bond 42 applied around the insertion opening 36, and covers the insertion opening 36 from above. The slider 39 has the magnetic head 38, an optical waveguide 51, and a near-field light generation member 54 mounted thereon.

The magnetic head 38 is mounted on the surface of the slider 39 and is opposed to the magnetic disk 52 indicated by phantom line in FIG. 3 so that information can be read from and written to the magnetic disk 52.

The optical waveguide 51 is provided in order to allow light emitted from the light emitting device 40, to be explained below, to enter the near-field light generation member 54, and is formed so as to extend along the thickness direction. The near-field light generation member 54 is provided on the upper end of the optical waveguide 51.

The near-field light generation member 54 is provided in order to allow near-field light to generate from the light which is entered from the optical waveguide 51, then apply the near-field light onto the magnetic disk 52 to thereby heat a minute region on the magnetic disk 52. Such near-field light generation member 54 is made of a metal scatterer, an opening, or the like, and a known near-field light generator described in, for example, Japanese Unexamined Patent Publication No. 2007-280572, Japanese Unexamined Patent Publication No. 2007-052918, Japanese Unexamined Patent Publication No. 2007-207349, or Japanese Unexamined Patent Publication No. 2008-130106, is used.

The light emitting device 40 is a light source for allowing light to enter the optical waveguide 51, and for example, converts electric energy into light energy to emit high-energy light from an emission port.

The light emitting device 40 is arranged on the back surface of the slider 39. In particular, the light emitting device 40 is mounted on the back surface of the slider 39 so as to be inserted through the insertion opening 36 in the metal supporting board 11. The light emitting device 40 is mounted on the slider 39 so that the emission port is opposed to the optical waveguide 51.

The light emitting device 40 is formed thicker than the metal supporting board 11, so that the lower end portion (the side end portion of the back surface) of the light emitting device 40 protrudes toward the back side further from the back surface of the metal supporting board 11.

Next, the conductive portion 24 will be described in detail.

In FIGS. 1, 2, and 4, a plurality (two pieces) of conductive portions 24 are arranged partway (in the middle of) the wire turning portion 6 in the widthwise direction at a spaced interval in the widthwise direction, each provided corresponding to the front-side power supply wires 25 and the back-side power supply wires 26.

Each of the conductive portions 24 is continuous with the front end portions of the front-side power supply wires 25, and the front end portions of the back-side power supply wires 26. Specifically, the conductive portions 24 includes a first conductive portion 24a and a second conductive portion 24b, which are connected corresponding to the first front-side power supply wire 25a and the second front-side power supply wire 25b, respectively. Further, the first conductive portion 24a and the second conductive portion 24b are connected corresponding to the first back-side power supply wire 26a and the second back-side power supply wire 26b, respectively.

The first conductive portion 24a and the second conductive portion 24b are arranged on one side and on the other side, respectively, in the widthwise direction.

The second conductive portion 24b is exemplified and the shape thereof will be described in detail hereinafter. The first conductive portion 24a is also formed in generally the same shape as the second conductive portion 24b.

As shown in FIG. 4, the second conductive portion 24b is formed with the metal supporting board 11, the first insulating base layer 12 formed on the surface of the metal supporting board 11, the front-side conductive portion 27 formed on the surface of the first insulating base layer 12, and the first insulating cover layer 14 formed on the surface of the first insulating base layer 12 so as to cover the front-side conductive portion 27.

The second conductive portion 24b is also formed with the second insulating base layer 18 formed on the back surface of the metal supporting board 11, the back-side conductive portion 28 formed on the back surface of the second insulating base layer 18, and the second insulating cover layer 20 formed on the back surface of the second insulating base layer 18 so as to cover the back-side conductive portion 28.

In the second conductive portion 24b, the metal supporting board 11 has a first metal opening 29 formed in a generally circular shape in plane view extending therethrough in the thickness direction. The first metal opening 29 has an inner diameter (maximum length) D1 in the range of, for example, 50 to 300 µm, or preferably 100 to 250 µm.

The first insulating base layer 12 covers the peripheral end edge (the upper end of the peripheral surface) of the first metal opening 29 in the metal supporting board 11 so as to form a first center opening 30 extending through the center portion of the first metal opening 29 in the thickness direction in plane view. In particular, the first insulating base layer 12 is formed in an annular shape in plane view covering the peripheral end face of the first metal opening 29 in the metal supporting board 11.

The front-side conductive portion 27 is continuously formed over the surface (upper surface) of the first insulating base layer 12, the peripheral surface of the first center opening 30 in the first insulating base layer 12, and the surface (upper surface, to be described later) of the back-side conductive portion 28 exposed from the first center opening 30, and is filled in the first center opening 30.

The first insulating cover layer 14 has a generally circular shape in plane view, and is formed so that its peripheral end edge is arranged in the same position as the peripheral end edge of the first insulating base layer 12.

The second insulating base layer 18 is formed so that its peripheral end edge is arranged in the same position as the peripheral end edge of the first insulating base layer 12 as viewed in plane. More specifically, the second insulating base layer 18 covers the peripheral end edge (peripheral surface) of the first metal opening 29 in the metal supporting board 11 so as to form a second center opening 31 extending through the center portion of the first metal opening 29 in the thickness direction in plane view. In particular, the second insulating base layer 18 is formed in a generally annular shape in plane view covering the peripheral end face of the first metal opening 29 in the metal supporting board 11.

The second center opening 31 in the second insulating base layer 18 is opposed to the first center opening 30 in the first insulating base layer 12 in the thickness direction, and specifically, is formed so as to be arranged in the same position as the first center opening 30 in plane view.

The first center opening 30 and the second center opening 31 each have an inner diameter (maximum length) D2 in the range of, for example, 20 to 280 µm, or preferably 40 to 200 µm.

Thus, the surface (upper surface) of the second insulating base layer 18 protruding toward the inner side of the first metal opening 29 is in contact with the back surface (under surface) of the first insulating base layer 12 protruding toward the inner side of the first metal opening 29.

The back-side conductive portion 28 is formed continuously with the back surface (under surface) of the second insulating base layer 18 and the peripheral surface of the second center opening 31 in the second insulating base layer 18. Further, the back-side conductive portion 28 is filled in the second center opening 31.

Thus, the front-side conductive portion 27 and the back-side conductive portion 28 are in direct contact with each other in an opposed portion between the first center opening 30 and the second center opening 31. That is, the front-side conductive portion 27 and the back-side conductive portion 28 are electrically connected with each other.

The second insulating cover layer 20 has a generally circular shape in plane view, with its peripheral end edge being formed in the same position as the peripheral end edge of the second insulating base layer 18.

Next, a method for producing the suspension board with circuit 1 will be described with reference to FIGS. 5 and 6.

In this method, a metal supporting board 11 is first prepared, as shown in FIG. 5(a).

Then, as shown in FIG. 5(b), a varnish of photosensitive insulating material is applied to the surface of the metal supporting board 11, and is dried. Thereafter, the dried varnish is exposed to light and developed, and then heated to be cured, so that a first insulating base layer 12 is formed in a pattern formed with the above-mentioned first center opening 30.

Next, as shown in FIG. 5(c), a first conductive pattern 13 and a front-side second conductive pattern 47 are formed on the surface of the first insulating base layer 12 by an additive method or a subtractive method. Thus, the first center opening 30 is filled with a front-side conductive portion 27.

Then, as shown in FIG. 5(d), a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 5(e), a first metal opening 29 is formed in the metal supporting board 11. The first metal opening 29 is formed by, for example, etching method such as dry etching (e.g., plasma etching) and wet etching (e.g., chemical etching), or for example, drill boring and laser processing. Preferably, the first metal opening 29 is formed by wet etching.

Thus, the back surface of the first insulating base layer 12 and the back surface of the front-side conductive portion 27 filled in the first center opening 30 are exposed from the first metal opening 29 in the metal supporting board 11.

Then, as shown in FIG. 5(f), a varnish of photosensitive insulating material is applied to the back surface (including the back surface of the first insulating base layer 12 and the back surface of the front-side conductive portion 27) of the metal supporting board 11, and is dried. Thereafter, the dried varnish is exposed to light and developed, and then heated to be cured, so that a second insulating base layer 18 is formed in a pattern formed with the above-mentioned second center opening 31.

Thus, the back surface of the first insulating base layer 12 exposed from the first metal opening 29 is covered with the second insulating base layer 18 so that the back surface of the front-side conductive portion 27 filled in the first center opening 30 in the first insulating base layer 12 is exposed from the second center opening 31.

Next, as shown in FIG. 6(g), a back-side second conductive pattern 48 is formed on the back surface of the second insulating base layer 18 by an additive method or a subtractive method. Thus, the second center opening 31 is filled with a back-side conductive portion 28.

Then, as shown in FIG. 6(h), a varnish of photosensitive insulating material is applied to the back surface of the second insulating base layer 18 so as to cover the second conductive pattern 48, and is dried. Thereafter, the dried varnish is exposed to light and developed, and then heated to be cured, so that a second insulating cover layer 20 is formed in the above-mentioned pattern.

Then, as shown in FIG. 6(i), a slit portion 4 and an insertion opening 36 are formed in the metal supporting board 11. The slit portion 4 and the insertion opening 36 are formed by, for example, etching method such as dry etching (e.g., plasma etching) and wet etching (e.g., chemical etching), or for example, drill boring and laser processing. At the same time, the metal supporting board 11 is trimmed.

Thereafter, as shown in FIG. 6(j), on the surface side of the suspension board with circuit 1, a slider 39 having a light emitting device 40 mounted on the back surface thereof is mounted in a slider mounting region 43 via an adhesive bond 42 so that the light emitting device 40 is inserted through the insertion opening 36. Then, a magnetic head 38 is electrically connected with head-side terminals 16 via solder balls 41, and an external circuit board, which is not shown, is electrically connected with external terminals 17.

Subsequently, the light emitting device 40 is electrically connected with device-side terminals 22 through wires 53 on the back surface side of the suspension board with circuit 1. Further, on the front side of the suspension board with circuit 1, a power source, which is not shown, is electrically connected with supply-side terminals 23.

Thus, the suspension board with circuit 1 is obtained.

Thereafter, in a hard disk drive, the back surface of a wire portion 2 is mounted on a surface of a load beam to support the wire portion 2.

The hard disk drive mounted with such suspension board with circuit 1 can adopt an optical assist system.

Specifically, in such hard disk drive, the magnetic disk 52 indicated by phantom line in FIG. 3 travels relatively to a near-field light generation member 54 and a magnetic head 38. A light emitted from the light emitting device 40 passes through an optical waveguide 51 and reaches the near-field light generation member 54. Then, a near-field light generated by the near-field light generation member 54 is applied to the surface of the magnetic disk 52 which is opposed to the upper side of the near-field light generation member 54. Then, the application of the near-field light from the near-field light generation member 54 heats the surface of the magnetic disk 52. In such state, a magnetic field is applied from the magnetic head 38, whereby information is recorded on the magnetic disk 52. At the time, the coercive force of the magnetic disk 52 is reduced, so that the information can be recorded on the magnetic disk 52 at high density by applying a small magnetic field.

The suspension board with circuit 1 has the head-side terminals 16 and the device-side terminals 22 formed on the surface and the back surface thereof, respectively.

Therefore, design flexibility of the layout of the head-side terminals 16 and the device-side terminals 22 can be enhanced, and each of the terminals can be formed at an arrangement density that does not cause a short circuit.

As a result, the suspension board with circuit 1 can be made compact and the connection reliability of the head-side terminals 16 and the device-side terminals 22 can be improved.

Further, the suspension board with circuit 1 has the slider 39 and the light emitting device 40 arranged on the surface side and the back surface side thereof, respectively.

Therefore, the magnetic head 38 and the light emitting device 40 are electrically connected to the head-side terminals 16 and the device-side terminals 22, respectively, both terminals having enhanced design flexibility of the layout, whereby the design flexibility of the layout of the slider 39 and the light emitting device 40 can be enhanced.

The power supply wire 21 of the suspension board with circuit 1 includes front-side power supply wires 25, back-side power supply wires 26, and conductive portions 24 which allow these wires to conduct. Therefore, the front-side power supply wires 25 and the back-side power supply wires 26 are formed on the surface and the back surface, respectively, in the mounting portion 3 of the suspension board with circuit 1, whereby the arrangement density of the wire (pattern) on the surface and the back surface of the mounting portion 3 is kept low, and the wire portion 2 is supported on a load beam without forming any wire on the back surface of the wire portion 2, so that the rigidity of the suspension board with circuit 1 can be improved.

Further, the conductive portions 24 can reliably maintain conduction between the front-side power supply wires 25 and the back-side power supply wires 26.

Specifically, in the conductive portions 24, the front-side conductive portion 27 formed continuously with the front-side power supply wires 25 is brought into direct contact with the back-side conductive portion 28 formed continuously with the back-side power supply wires 26, whereby the conduction between the front-side power supply wires 25 and the back-side power supply wires 26 can be more reliably maintained.

Furthermore, in the conductive portions 24, the front-side conductive portion 27 and the back-side conductive portion 28 are in direct contact with each other in an opposed portion between the first center opening 30 and the second center opening 31, so that the electrical properties of the conductive portions 24 can be improved.

In the above description, two power supply wires 21, two device-side terminals 22, and two supply-side terminals 23 are provided. However, the number thereof is not particularly limited, and for example, one piece, or three or more pieces of the respective components may be provided, though not shown.

In the above description, six signal wires 15, six head-side terminals 16, and six external terminals 17 are provided. However, the number thereof is not particularly limited, and for example, one to five pieces, or seven or more pieces of the respective components may be provided, though not shown.

In the step of mounting the slider 39 (the step shown in FIG. 6(j)) as described above, the slider 39 having the light emitting device 40 mounted thereon is mounted on the suspension board with circuit 1. However, for example, without mounting the light emitting device 40, the slider 39 may be first mounted on the suspension board with circuit 1. Then, the light emitting device 40 may be inserted through the insertion opening 36 and mounted on the back surface of the slider 39 that has been mounted on the suspension board with circuit 1.

Figure 7:
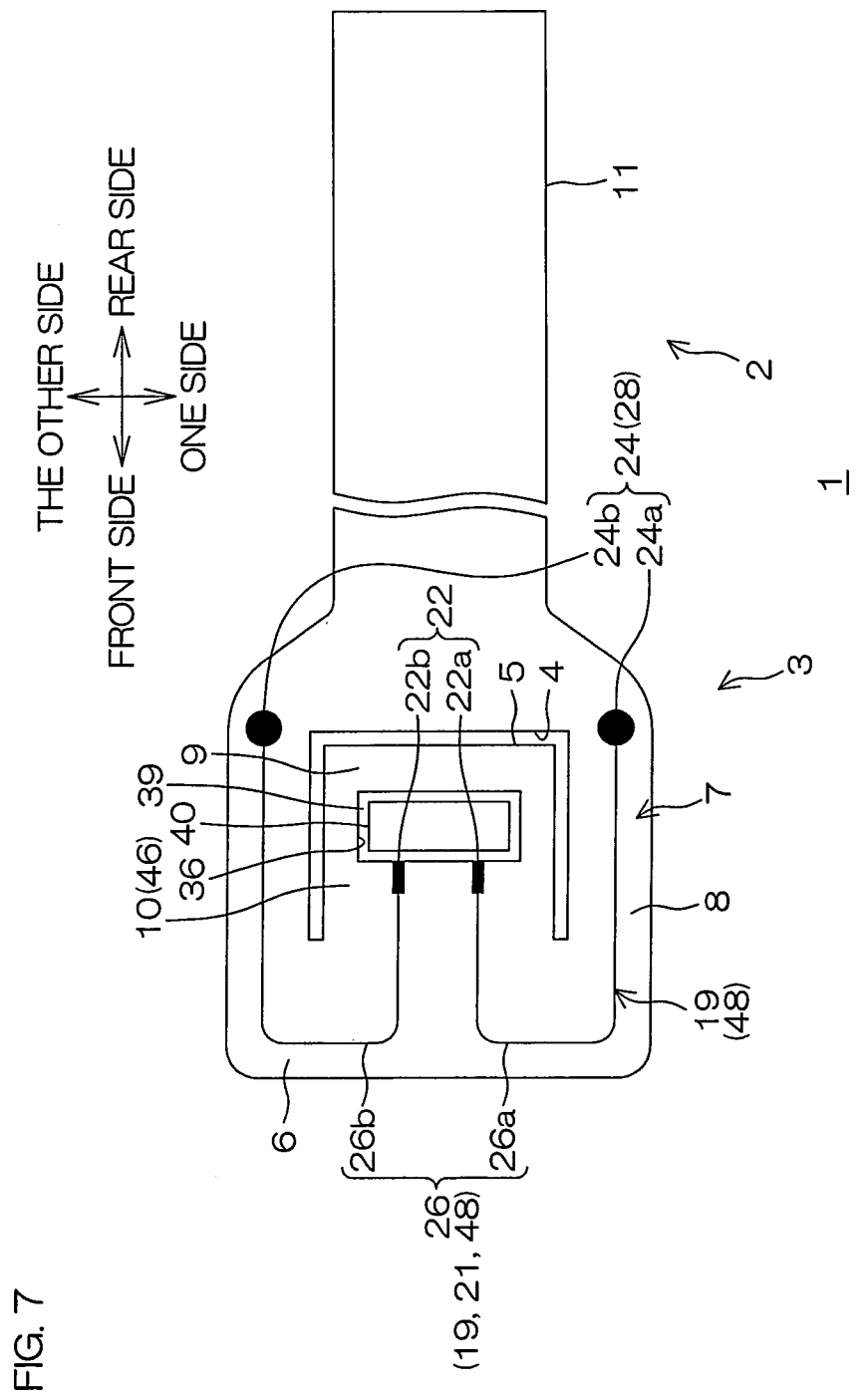
FIG. 7 is a bottom view illustrating a suspension board with circuit of another embodiment according to the present invention.

FIG. 7 is a bottom view illustrating a suspension board with circuit of another embodiment according to the present invention. The same reference numerals are provided in each of the subsequent figures for members corresponding to each of those described above, and their detailed description is omitted.

In the above description, the conductive portions 24 are provided in the wire turning portion 6 of the mounting portion 3. However, the arrangement thereof is not limited, and, for example, as shown in FIG. 7, the conductive portions 24 may be provided in the outrigger portion 8 of the mounting portion 3.

Specifically, the conductive portions 24 are formed in the rear end portion of the outrigger portion 8. The first conductive portion 24a and the second conductive portion 24b are arranged on one side and on the other side, respectively, in the widthwise direction in the outrigger portion 8.

Specifically, the first back-side power supply wire 26a is arranged in the following manner. The wire 26a reaches the wire turning portion 6 on one side in the widthwise direction from the first conductive portion 24a in the outrigger portion 8 on one side in the widthwise direction, and then extends toward the other side (inner side) in the widthwise direction of the wire turning portion 6. Subsequently, it further turns back toward the rear end side, extends from the rear end of the wire turning portion 6 toward the rear end side, and finally reaches the front end portion of the head-side terminal 16 in the device-side terminal forming portion 46.

Also, the second back-side power supply wire 26b is arranged in the following manner. The wire 26b reaches the wire turning portion 6 on the other side in the widthwise direction from the second conductive portion 24b in the outrigger portion 8 on the other side in the widthwise direction, and then extends toward one side (inner side) in the widthwise direction of the wire turning portion 6. Subsequently, it further turns back toward the rear end side, extends from the rear end of the wire turning portion 6 toward the rear end side, and finally reaches the front end portion of the head-side terminal 16 in the device-side terminal forming portion 46.

The conductive portion 24 can also be provided in the wire portion 2, though not shown.

Preferably, as shown in FIGS. 2 and 7, the conductive portion 24 is provided in the mounting portion 3. Thus, in mounting the suspension board with circuit 1 to the load beam, the back surface of the wire portion 2 without a conductive portion 24 formed thereon is brought into contact with the load beam, so that the wire portion 2 can be reliably supported thereon.

Figure 8:
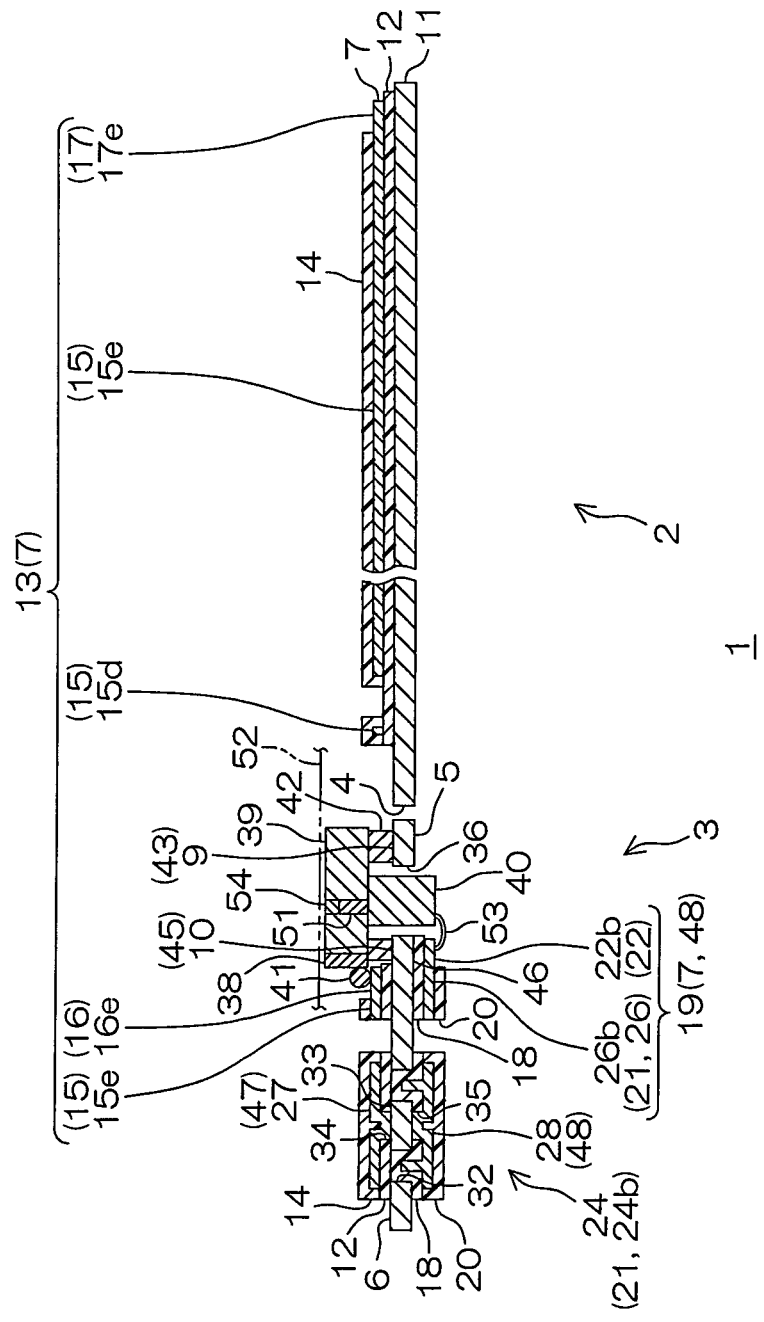
FIG. 8 is a sectional view illustrating a suspension board with circuit of another embodiment according to the present invention.
Figure 9:
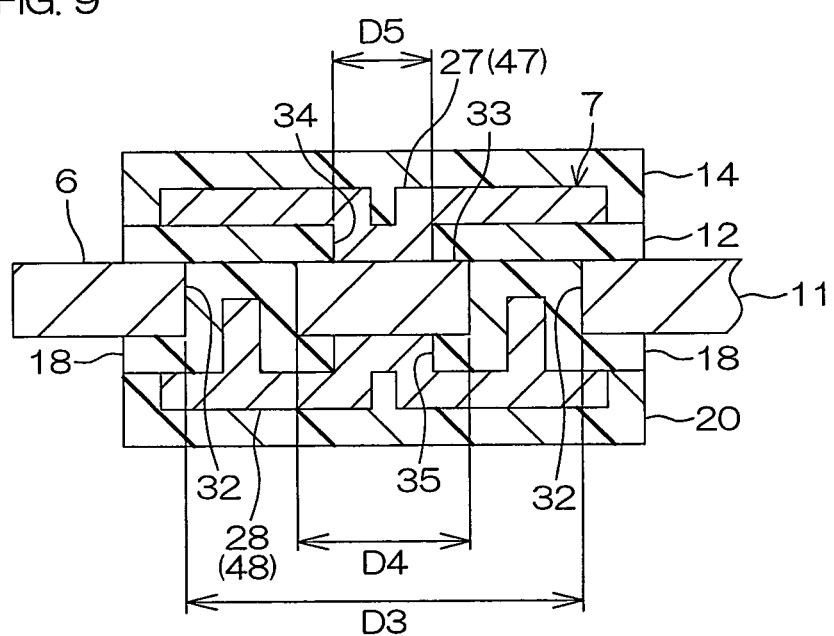
FIG. 9 is an enlarged sectional view of a conductive portion shown in FIG. 8.
Figure 10:
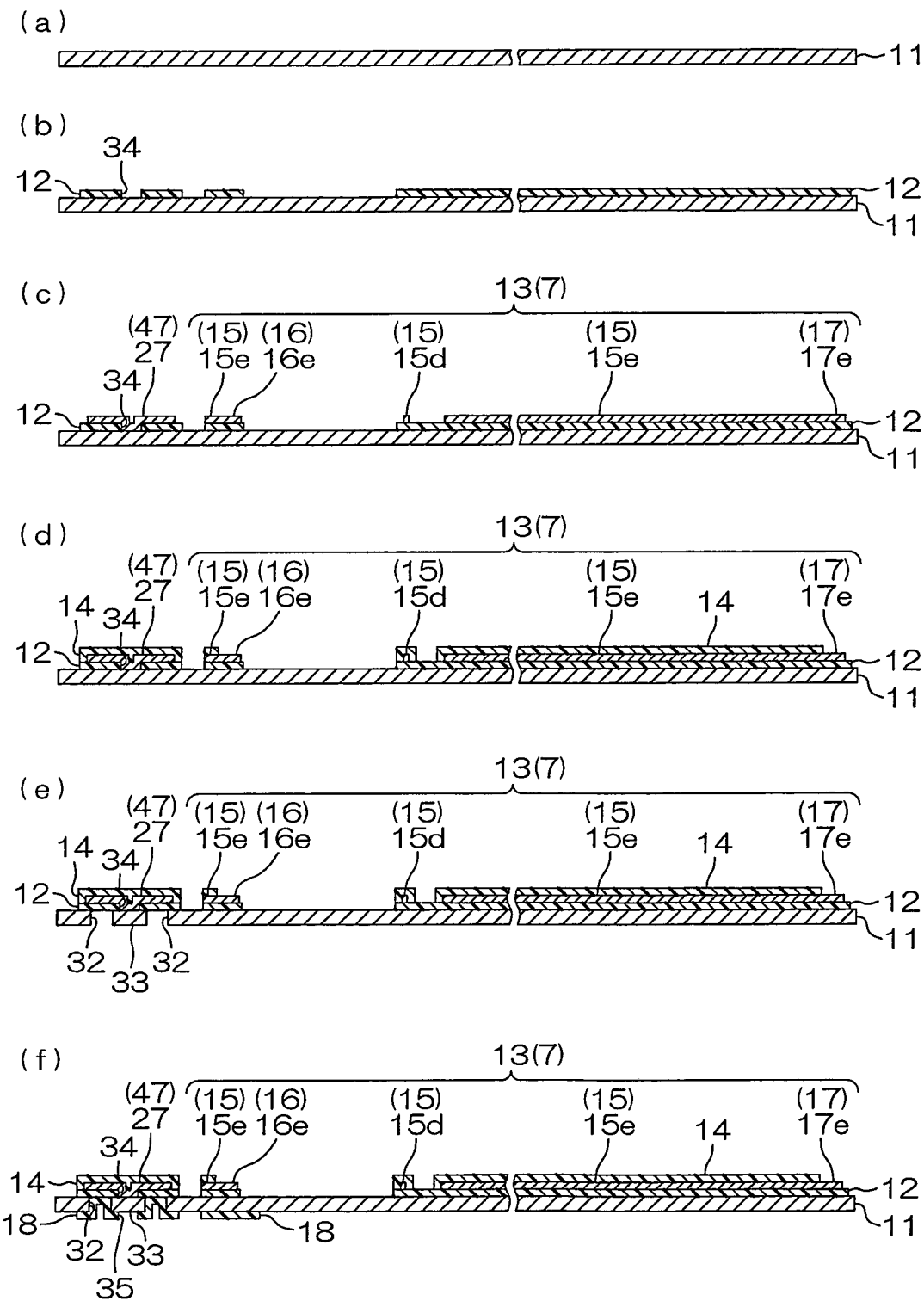
FIG. 10 is a process diagram explaining a method for producing the suspension board with circuit shown in FIG. 8, (a) showing the step of preparing a metal supporting board, (b) showing the step of forming a first insulating base layer, (c) showing the step of forming a first conductive pattern and a front-side second conductive pattern, (d) showing the step of forming a first insulating cover layer, (e) showing the step of forming an annular opening in the metal supporting board, and (f) showing the step of forming a second insulating base layer.
Figure 11:
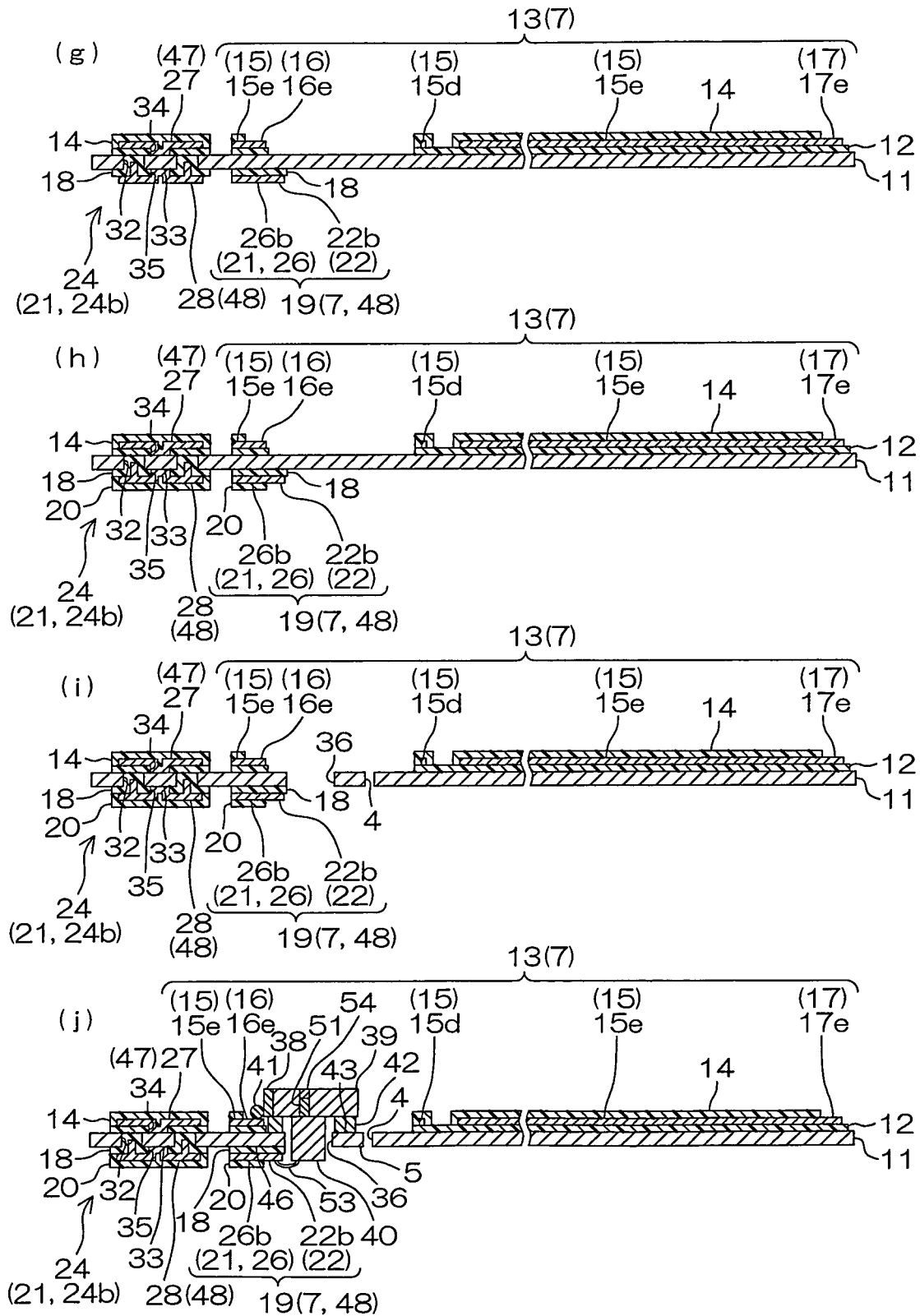
FIG. 11 is a process diagram explaining the method for producing the suspension board with circuit shown in FIG. 8, subsequent to FIG. 10, (g) showing the step of forming a back-side second conductive pattern, (h) showing the step of forming a second insulating cover layer, (i) showing the step of forming a slit portion and a first opening in the metal supporting board, and (j) showing the step of mounting a slider.

FIG. 8 is a sectional view illustrating a suspension board with circuit of another embodiment according to the present invention; FIG. 9 is an enlarged sectional view of a conductive portion shown in FIG. 8; and FIGS. 10 and 11 are process diagrams explaining a method for producing the suspension board with circuit shown in FIG. 9.

Next, a suspension board with circuit of another embodiment according to the present invention will be described with reference to FIGS. 8 to 11.

In the above description, in the conductive portion 24, the first metal opening 29 having a generally circular shape in plane view is formed in the metal supporting board 11. However, for example, as shown in FIGS. 8 and 9, instead of the first metal opening 29, an annular opening 32 having a generally annular shape in plane view may be formed.

In FIGS. 8 and 9, the annular opening 32 is formed extending through the metal supporting board 11 in the thickness direction. The annular opening 32 has an outer diameter (maximum peripheral length) D3 in the range of, for example, 90 to 300 µm, or preferably 140 to 250 µm.

Thus, the conductive portion 24 is provided with an insulated conductive portion 33. The insulated conductive portion 33 is arranged within the annular opening 32 and is insulated from the metal supporting board 11 around the annular opening 32.

Specifically, the insulated conductive portion 33 is formed in a generally circular shape in plane view and is spaced inward from the outer peripheral edge of the annular opening 32 in the metal supporting board 11. The insulated conductive portion 33 has an outer diameter (maximum length) D4 in the range of, for example, 30 to 240 µm, or preferably 50 to 200 µm.

The first insulating base layer 12 covers the annular opening 32 and has a first base opening 34 formed therein serving as a first insulating opening which exposes the insulated conductive portion 33.

In particular, the first base opening 34 exposes the surface of the center portion of the insulated conductive portion 33 and is formed in a generally annular shape in plane view.

The front-side conductive portion 27 is filled in the first base opening 34. That is, the front-side conductive portion 27 is in contact with the surface of the insulated conductive portion 33 exposed from the first base opening 34 in the first insulating base layer 12.

Further, the second insulating base layer 18 covers the annular opening 32 in the metal supporting board 11. Specifically, the second insulating base layer 18 is formed continuously with the outer and inner peripheral surfaces of the annular opening 32 in the metal supporting board 11, the back surface of the first insulating base layer 12 exposed from the annular opening 32, and the peripheral end of the back surface of the insulated conductive portion 33.

The second insulating base layer 18 has a second base opening 35 formed therein serving as a second insulating opening which exposes the insulated conductive portion 33. In particular, the second base opening 35 exposes the back surface of the center portion of the insulated conductive portion 33 and is formed in a generally circular shape in plane view. The second base opening 35 in the second insulating base layer 18 is opposed to the first base opening 34 in the first insulating base layer 12 in the thickness direction, and more particularly, these two openings are formed so as to be arranged in the same position when projected in the thickness direction.

The back-side conductive portion 28 is filled in the second base opening 35. That is, the back-side conductive portion 28 is in contact with the back surface of the insulated conductive portion 33 exposed from the second base opening 35 in the second insulating base layer 18.

Thus, the front-side conductive portion 27 and the back-side conductive portion 28 are electrically connected with each other through the insulated conductive portion 33.

Next, a method for producing the suspension board with circuit 1 will be described with reference to FIGS. 10 and 11.

In this method, a metal supporting board 11 is first prepared, as shown in FIG. 10(*a*).

Then, as shown in FIG. 10(*b*), a varnish of photosensitive insulating material is applied to the surface of the metal supporting board 11, and is dried. Thereafter, the dried varnish is exposed to light and developed, and then heated to be cured, so that a first insulating base layer 12 is formed in a pattern formed with the above-mentioned first base opening 34.

Next, as shown in FIG. 10(*c*), a first conductive pattern 13 and a front-side second conductive pattern 47 are formed on the surface of the first insulating base layer 12 by an additive method or a subtractive method. Thus, the first base opening 34 is filled with a front-side conductive portion 27.

Then, as shown in FIG. 10(*d*), a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 10(*e*), an annular opening 32 is formed in the metal supporting board 11. The annular opening 32 is formed by, for example, etching method such as dry etching (e.g., plasma etching) and wet etching (e.g., chemical etching), or for example, drill boring and laser processing. Preferably, the annular opening 32 is formed by wet etching.

Thus, the back surface of the first insulating base layer 12 is exposed from the annular opening 32 in the metal supporting board 11. Further, an insulated conductive portion 33 is formed in the metal supporting board 11.

Then, as shown in FIG. 10(*f*), a varnish of photosensitive insulating material is applied to the back surface of the metal supporting board 11 (including the back surface of the first insulating base layer 12), and is dried. Thereafter, the dried varnish is exposed to light and developed, and then heated to be cured, so that a second insulating base layer 18 is formed in a pattern formed with the above-mentioned second base opening 35.

Thus, the second insulating base layer 18 covers the back surface of the first insulating base layer 12 exposed from the annular opening 32, and the back surface of the insulated conductive portion 33 is exposed from the second base opening 35.

Next, as shown in FIG. 11(*g*), a back-side second conductive pattern 48 is formed on the back surface of the second insulating base layer 18 by an additive method or a subtractive method. Thus, the second base opening 35 is filled with a back-side conductive portion 28.

Then, as shown in FIG. 11(*h*), a varnish of photosensitive insulating material is applied to the back surface of the second insulating base layer 18 so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 11(*i*), a slit portion 4 and an insertion opening 36 are formed in the metal supporting board 11. The slit portion 4 and the insertion opening 36 are formed by, for example, etching method such as dry etching (e.g., plasma etching) and wet etching (e.g., chemical etching), or for example, drill boring and laser processing. At the same time, the metal supporting board 11 is trimmed.

Thereafter, as shown in FIG. 11(*j*), on the surface side of the suspension board with circuit 1, a slider 39 having a light emitting device 40 mounted on the back surface thereof is mounted in a slider mounting region 43 via an adhesive bond 42 so that the light emitting device 40 is inserted through the insertion opening 36. Then, a magnetic head 38 is electrically connected with head-side terminals 16 via solder balls 41, and an external circuit board, which is not shown, is electrically connected with external terminals 17.

Subsequently, the light emitting device 40 is electrically connected with device-side terminals 22 through wires 53 on the back surface side of the suspension board with circuit 1. Further, on the front side of the suspension board with circuit 1, a power source, which is not shown, is electrically connected with supply-side terminals 23.

Thus, the suspension board with circuit 1 is obtained.

Thereafter, in a hard disk drive, the back surface of a wire portion 2 is mounted on a surface of a load beam to support the wire portion 2.

In the suspension board with circuit 1, when the annular opening 32 is formed by an etching method (see FIG. 10(*e*)), the insulated conductive portion 33 prevents the front-side conductive portion 27 from being exposed to an etchant or the like, which in turn can prevent the front-side conductive portion 27 from being damaged. Therefore, the connection reliability of the conductive portion 24 can be stabilized and maintained.

Figure 12:
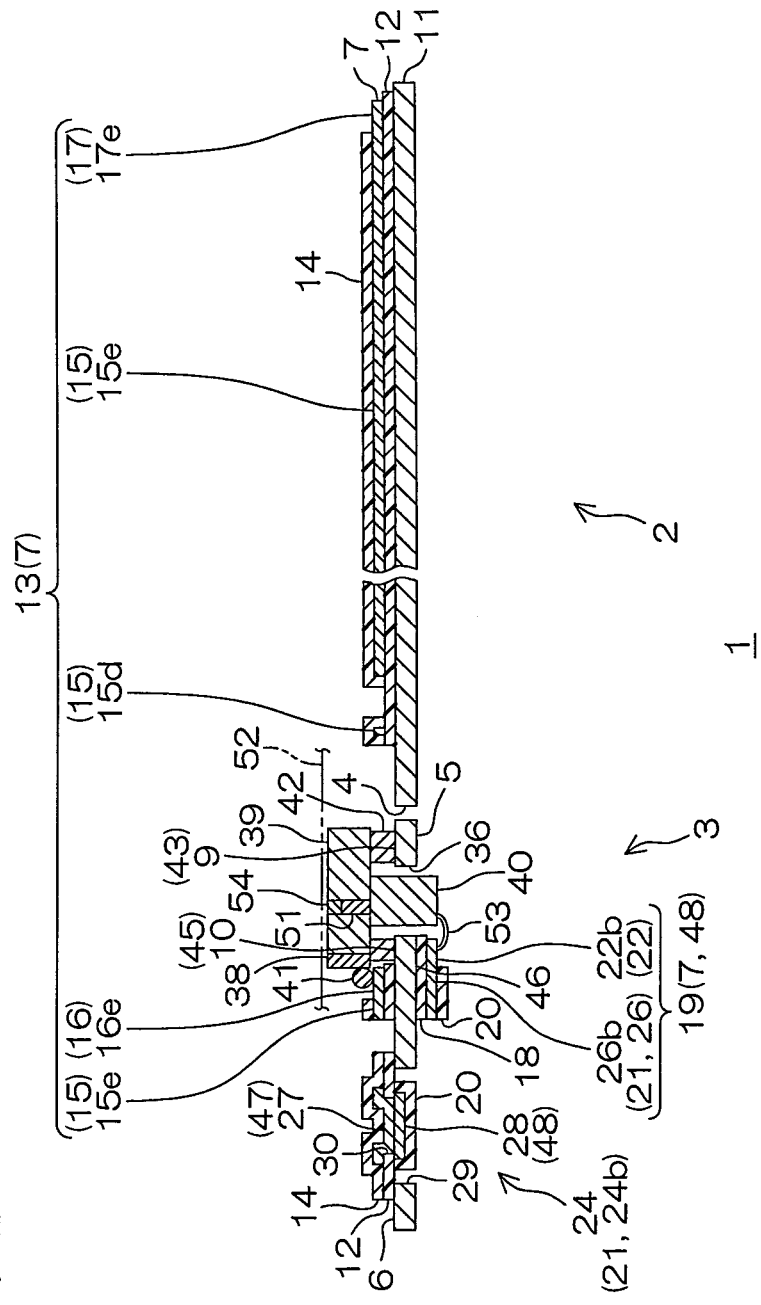
FIG. 12 is a sectional view illustrating a suspension board with circuit of another embodiment according to the present invention.
Figure 13:
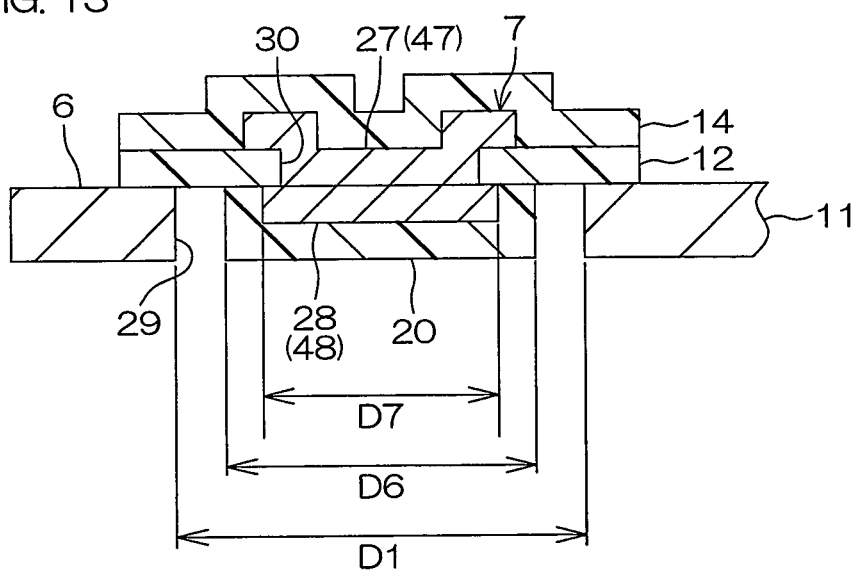
FIG. 13 is an enlarged sectional view of a conductive portion shown in FIG. 12.
Figure 15:
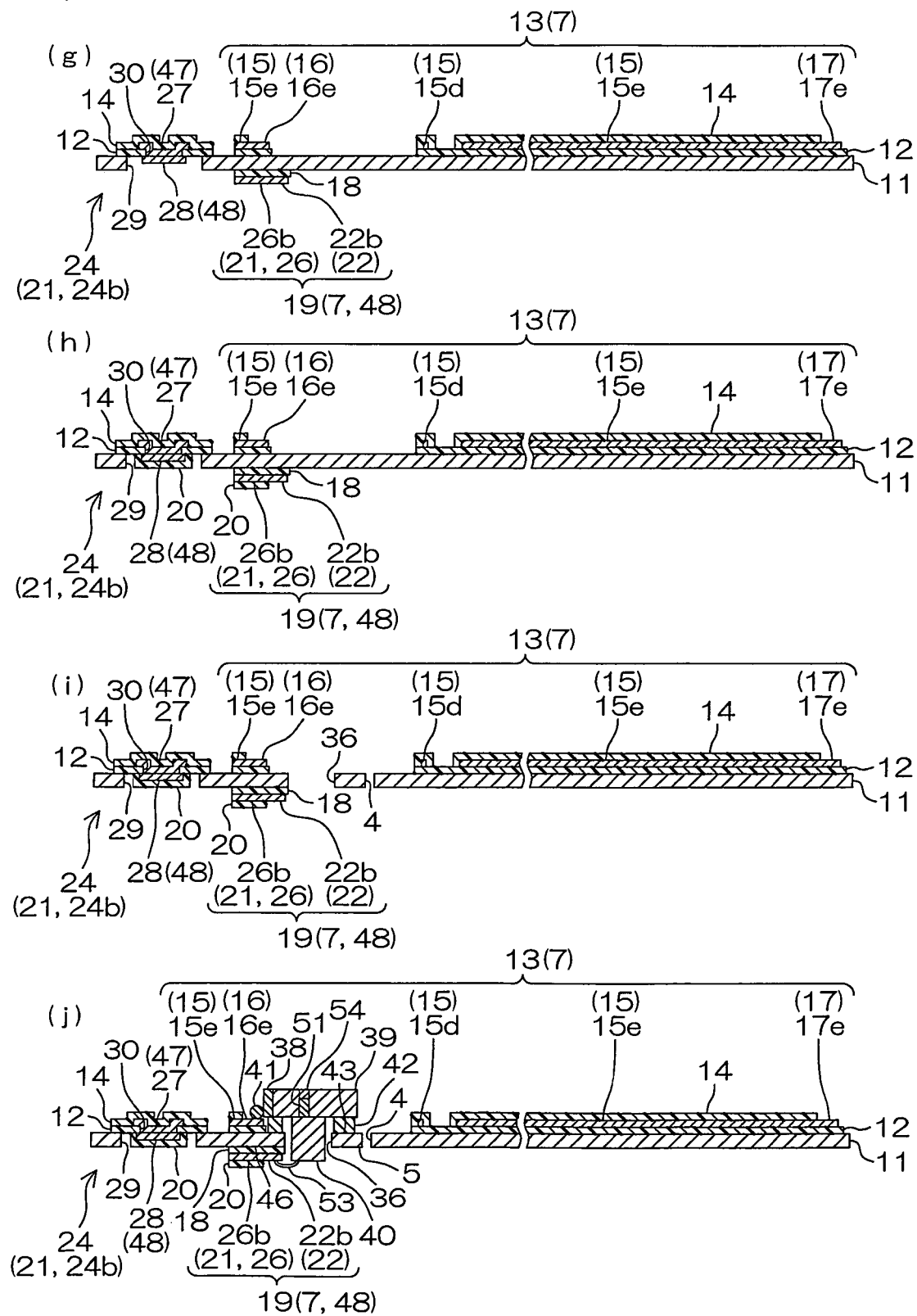
FIG. 15 is a process diagram explaining the method for producing the suspension board with circuit shown in FIG. 12, subsequent to FIG. 14, (g) showing the step of forming a back-side second conductive pattern, (h) showing the step of forming a second insulating cover layer, (i) showing the step of forming a slit portion and a first opening in the metal supporting board, and (j) showing the step of mounting a slider.

FIG. 12 is a sectional view illustrating a suspension board with circuit of another embodiment according to the present invention; FIG. 13 is an enlarged sectional view of a conductive portion shown in FIG. 12; and FIGS. 14 and 15 are process diagrams explaining a method for producing the suspension board with circuit shown in FIG. 12

In the above description, in the conductive portion 24, the second insulating base layer 18 is formed. However, for example, as shown in FIGS. 12 and 13, without forming the second insulating base layer 18, the back-side conductive portion 28 may be formed directly on the back surface of the first insulating base layer 12.

In FIGS. 12 and 13, the back-side conductive portion 28 is arranged within the first metal opening 29 in the metal supporting board 11, and is formed so as to be in contact with the front-side conductive portion 27 on the back surface of the first insulating base layer 12. Specifically, in the first metal opening 29, the back-side conductive portion 28 covers the first center opening 30 in the first insulating base layer 12. That is, in the first metal opening 29, the back-side conductive portion 28 covers the back surface of the front-side conductive portion 27 filled in the first center opening 30 in the first insulating base layer 12.

Thus, the front-side conductive portion 27 and the back-side conductive portion 28 are in direct contact with each other in the first center opening 30 in the first insulating base layer 12.

The second insulating cover layer 20 is arranged within the first metal opening 29 in the metal supporting board 11 and is formed on the back surface of the first insulating base layer 12 so as to cover the back-side conductive portion 28. The outer peripheral surface of the second insulating base layer 18 is spaced apart from the inner peripheral surface of the first metal opening 29 in the metal supporting board 11.

Next, a method for producing the suspension board with circuit 1 will be described with reference to FIGS. 14 and 15.

In this method, a metal supporting board 11 is first prepared, as shown in FIG. 14(a).

Then, as shown in FIG. 14(b), a varnish of photosensitive insulating material is applied to the surface of the metal supporting board 11, and is dried. Thereafter, the dried varnish is exposed to light and developed, and then heated to be cured, so that a first insulating base layer 12 is formed in a pattern formed with the above-mentioned first center opening 30.

Next, as shown in FIG. 14(c), a first conductive pattern 13 and a front-side second conductive pattern 47 are formed on the surface of the first insulating base layer 12 by an additive method or a subtractive method. Thus, the first center opening 30 is filled with a front-side conductive portion 27.

Then, as shown in FIG. 14(d), a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 14(e), a first metal opening 29 is formed in the metal supporting board 11. The first metal opening 29 is formed by, for example, etching method such as dry etching (e.g., plasma etching) and wet etching (e.g., chemical etching), or for example, drill boring and laser processing. Preferably, the first metal opening 29 is formed by wet etching.

Thus, the back surface of the first insulating base layer 12 and the back surface of the front-side conductive portion 27 filled in the first center opening 30 are exposed from the first metal opening 29 in the metal supporting board 11.

Then, as shown in FIG. 14(f), a varnish of photosensitive insulating material is applied to the back surface of the metal supporting board 11, and is dried. Thereafter, the dried varnish is exposed to light and developed, and then heated to be cured, so that a second insulating base layer 18 is formed in the above-mentioned pattern.

Next, as shown in FIG. 15(g), a back-side second conductive pattern 48 is formed on the back surface of the second insulating base layer 18 by an additive method or a subtractive method.

Then, as shown in FIG. 15(h), a varnish of photosensitive insulating material is applied to the back surface of the second insulating base layer 18 (including the first insulating base layer 12 exposed from the back-side conductive portion 28 within the first metal opening 29) so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 15(i), a slit portion 4 and an insertion opening 36 are formed in the metal supporting board 11. The slit portion 4 and the insertion opening 36 are formed by, for example, etching method such as dry etching (e.g., plasma etching) and wet etching (e.g., chemical etching), or for example, drill boring and laser processing. At the same time, the metal supporting board 11 is trimmed.

Thereafter, as shown in FIG. 15(j), on the surface side of the suspension board with circuit 1, a slider 39 having a light emitting device 40 mounted on the back surface thereof is mounted in a slider mounting region 43 via an adhesive bond 42 so that the light emitting device 40 is inserted through the insertion opening 36. Then, a magnetic head 38 is electrically connected with head-side terminals 16 via solder balls 41, and an external circuit board, which is not shown, is electrically connected with external terminals 17.

Subsequently, the light emitting device 40 is electrically connected with device-side terminals 22 through wires 53 on the back surface side of the suspension board with circuit 1. Further, on the front side of the suspension board with circuit 1, a power source, which is not shown, is electrically connected with supply-side terminals 23.

Thus, the suspension board with circuit 1 is obtained.

Thereafter, in a hard disk drive, the back surface of a wire portion 2 is mounted on a surface of a load beam to support the wire portion 2.

In the suspension board with circuit 1, since the second insulating base layer 18 is not formed in the conductive portion 24 and the back-side conductive portion 28 is formed within the first metal opening 29 in the metal supporting board 11, the conductive portion 24 can be made thinner.

Figure 16:
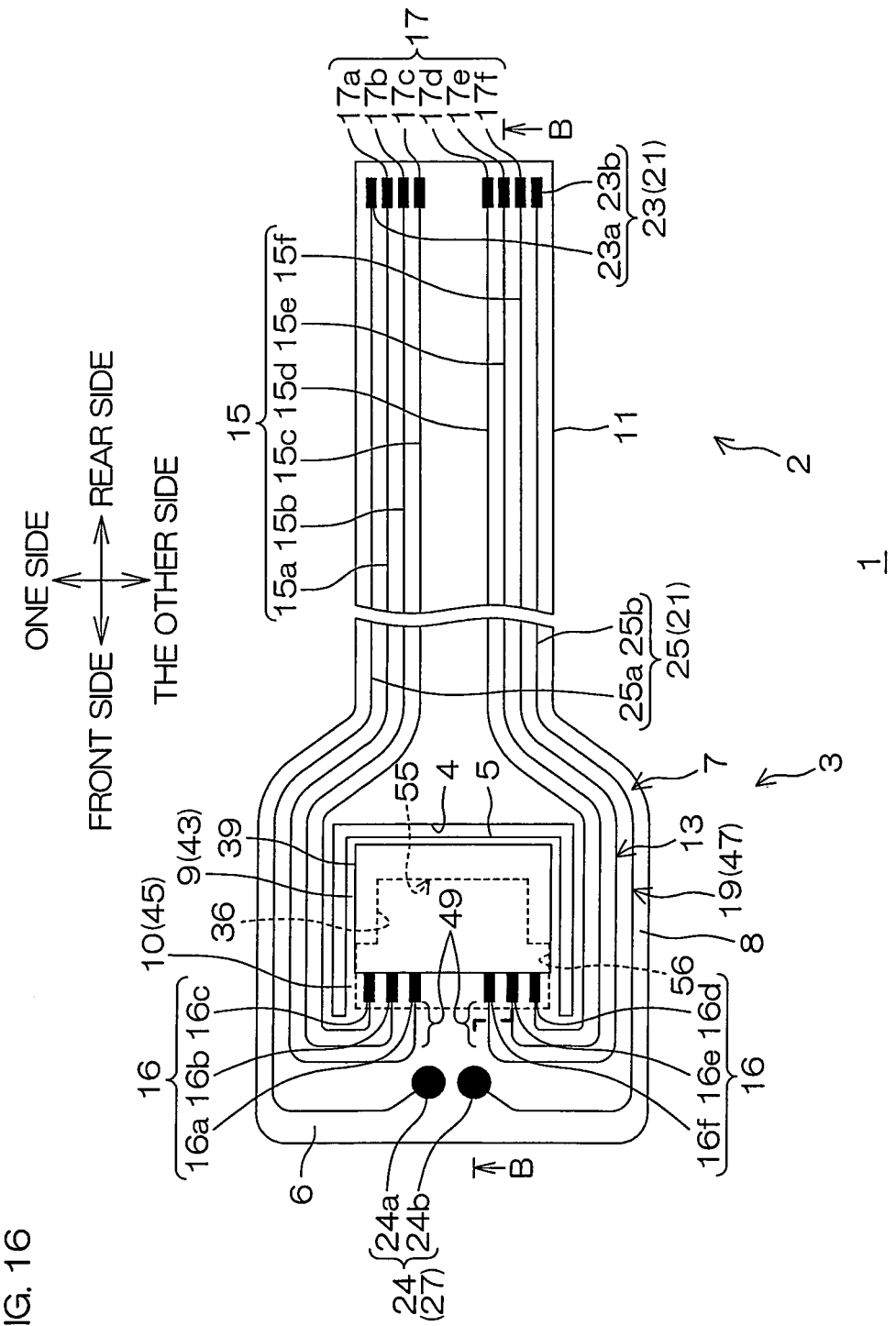
FIG. 16 is a plan view illustrating a suspension board with circuit of another embodiment according to the present invention.
Figure 17:
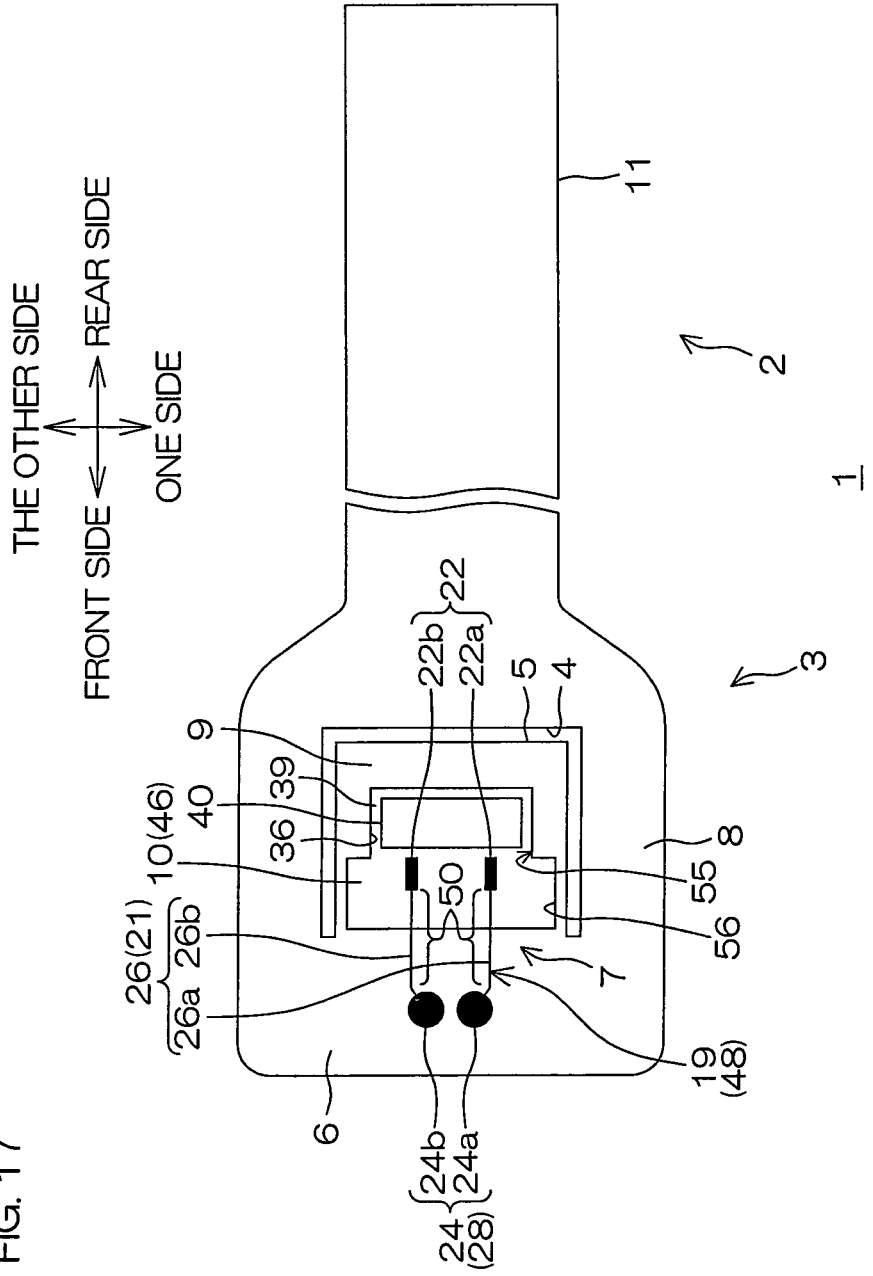
FIG. 17 is a bottom view of the suspension board with circuit shown in FIG. 16.
Figure 18:
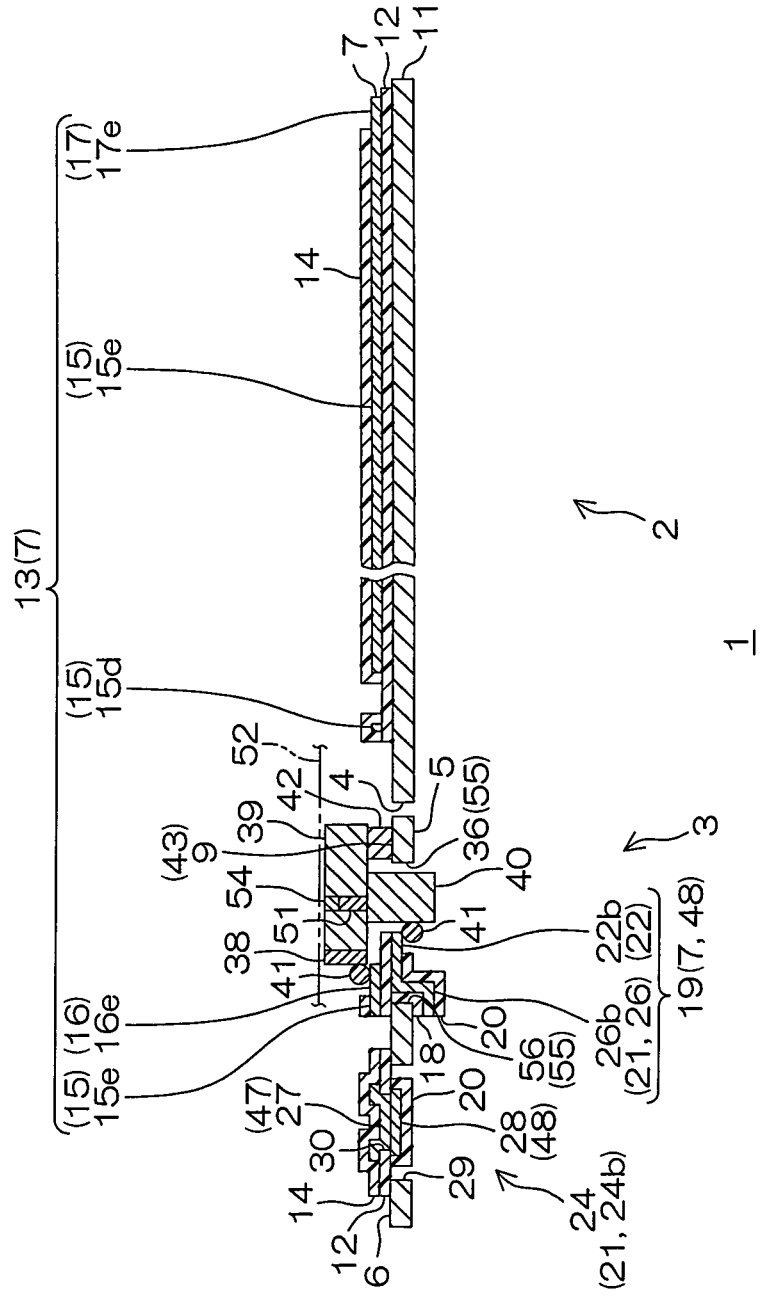
FIG. 18 is a sectional view of the suspension board with circuit taken along the line B-B shown in FIG. 16.
Figure 20:
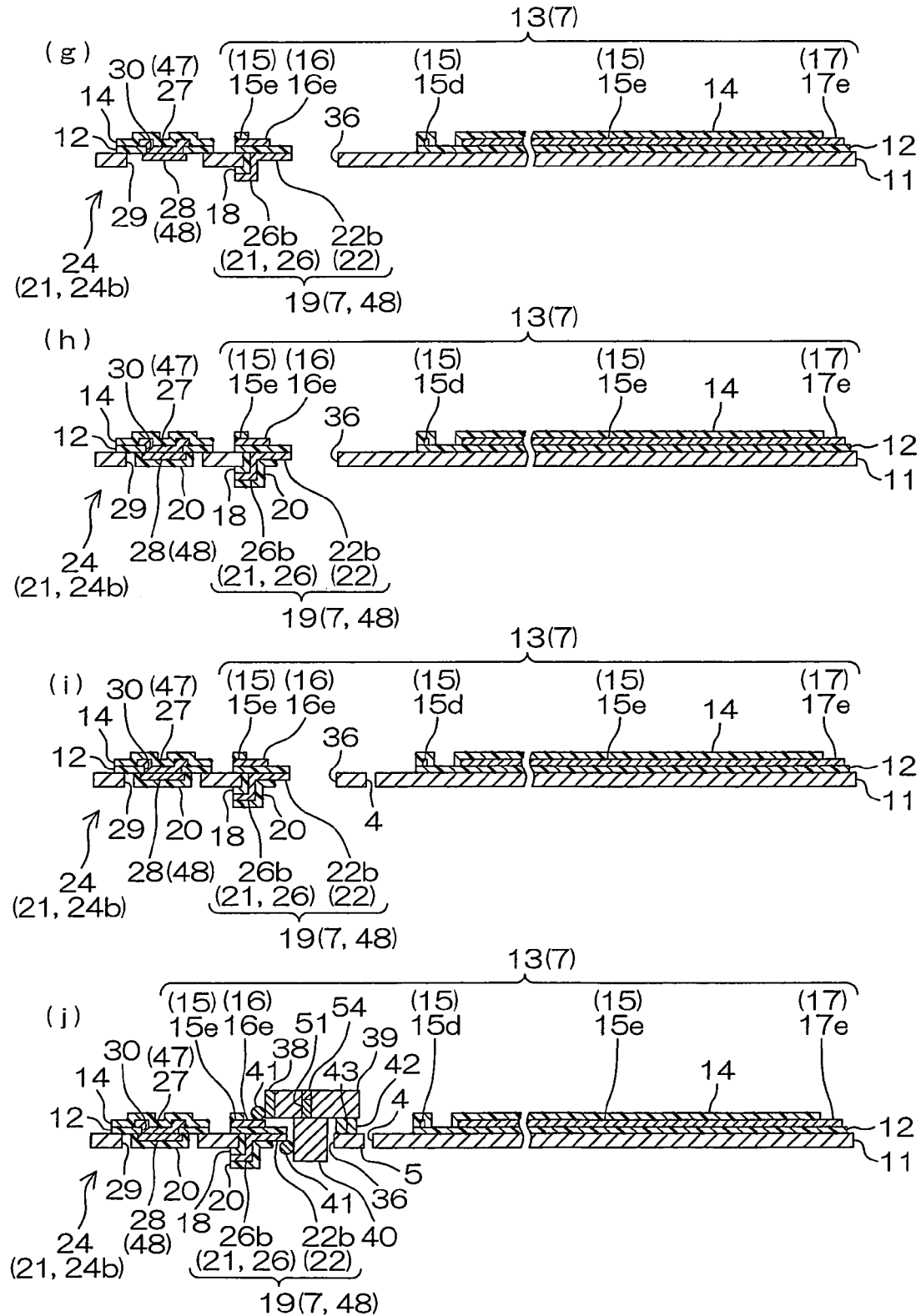
FIG. 20 is a process diagram explaining the method for producing the suspension board with circuit shown in FIG. 18, subsequent to FIG. 19, (g) showing the step of forming a back-side second conductive pattern, (h) showing the step of forming a second insulating cover layer, (i) showing the step of forming a slit portion in the metal supporting board, and (j) showing the step of mounting a slider.

FIG. 16 is a plan view illustrating a suspension board with circuit of another embodiment according to the present invention; FIG. 17 is a bottom view of the suspension board with circuit shown in FIG. 16; FIG. 18 is a sectional view of the suspension board with circuit taken along the line B-B shown in FIG. 16; and FIGS. 19 and 20 are process diagrams explaining a method for producing the suspension board with circuit shown in FIG. 18.

In the above description, the device-side terminals 22 are formed on the back surface (under surface) of the second insulating base layer 18. However, for example, as shown in FIG. 18, they may be formed on the back surface (under surface) of the first insulating base layer 12.

In FIGS. 16 and 17, the gimbal portion 5 has a third opening 55 formed therein exposing the plurality of device-side terminals 22.

The third opening 55 is formed extending through the metal supporting board 11 of the gimbal portion 5 in the thickness direction, including an insertion opening 36 and a terminal opening 56 which communicates with the insertion opening 36.

The insertion opening 36 is formed in the same shape as the insertion opening 36 mentioned above and has the light emitting device 40 inserted therein.

The terminal opening 56 is formed forward of the insertion opening 36 so as to communicate with the insertion opening 36, surrounds the plurality of device-side terminals 22 as viewed in plane, and has a generally rectangular shape longer in the widthwise direction as viewed in plane.

As shown in FIG. 18, the second insulating base layer 18 is formed on the inner peripheral surface (front end-side peripheral surface) of the metal supporting board 11 in the front end portion of the terminal opening 56.

The device-side terminals 22 are formed directly on the back surface of the first insulating base layer 12. Further, the device-side terminals 22 are electrically connected with the light emitting device 40 via the solder balls 41.

The back-side power supply wires 26 are formed continuously with the back surface of the second insulating base layer 18 (including the internal side surface of the second insulating base layer 18 formed on the front end-side peripheral surface of the metal supporting board 11) and the back surface of the first insulating base layer 12 exposed from the second insulating base layer 18.

Next, a method for producing the suspension board with circuit 1 will be described with reference to FIGS. 19 and 20.

In this method, a metal supporting board 11 is first prepared, as shown in FIG. 19(*a*).

Then, as shown in FIG. 19(*b*), a varnish of photosensitive insulating material is applied to the surface of the metal supporting board 11, and is dried. Thereafter, the dried varnish is exposed to light and developed, and then heated to be cured, so that a first insulating base layer 12 is formed in the above-mentioned pattern.

Next, as shown in FIG. 19(*c*), a first conductive pattern 13 and a front-side second conductive pattern 47 are formed on the surface of the first insulating base layer 12 by an additive method or a subtractive method.

Then, as shown in FIG. 19(*d*), a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 19(*e*), a first metal opening 29 and a third opening 55 are formed in the metal supporting board 11. The first metal opening 29 and the third opening 55 are formed by, for example, etching method such as dry etching (e.g., plasma etching) and wet etching (e.g., chemical etching), or for example, drill boring and laser processing. Preferably, the first metal opening 29 and the third opening 55 are formed by wet etching.

Thus, in the gimbal portion 5, the back surface of the first insulating base layer 12 is exposed from the third opening 55 in the metal supporting board 11.

Then, as shown in FIG. 19(*f*), a varnish of photosensitive insulating material is applied to the back surface of the metal supporting board 11 (including the back surface of the first insulating base layer 12 exposed from the third opening 55), and is dried. Thereafter, the dried varnish is exposed to light and developed, and then heated to be cured, so that a second insulating base layer 18 is formed in the above-mentioned pattern. Thus, the second insulating base layer 18 is formed on the front end-side peripheral surface of the terminal opening 56 in the metal supporting board 11.

Next, as shown in FIG. 20(*g*), a back-side second conductive pattern 48 is formed on the back surface of the second insulating base layer 18 (including the back surface of the first insulating base layer 12 exposed from the second insulating base layer 18) by an additive method or a subtractive method.

Thus, in the gimbal portion 5, device-side terminals 22 are formed directly on the back surface of the first insulating base layer 12. Further, in the gimbal portion 5 and the wire turning portion 6, back-side power supply wires 26 are formed continuously with the back surface of the second insulating base layer 18 and the back surface of the first insulating base layer 12 exposed from the second insulating base layer 18.

Then, as shown in FIG. 20(*h*), a varnish of photosensitive insulating material is applied to the back surface of the second insulating base layer 18 (including the first insulating base layer 12 exposed from the second insulating base layer 18) so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 20(*i*), a slit portion 4 is formed in the metal supporting board 11. The slit portion 4 is formed by, for example, etching method such as dry etching (e.g., plasma etching) and wet etching (e.g., chemical etching), or for example, drill boring and laser processing. At the same time, the metal supporting board 11 is trimmed.

Thereafter, as shown in FIG. 20(*j*), on the surface side of the suspension board with circuit 1, a slider 39 having a light emitting device 40 mounted on the back surface thereof is mounted in a slider mounting region 43 via an adhesive bond 42 so that the light emitting device 40 is inserted through the insertion opening 36. Then, a magnetic head 38 is electrically connected with head-side terminals 16 via solder balls 41, and an external circuit board, which is not shown, is electrically connected with external terminals 17.

Subsequently, the light emitting device 40 is electrically connected with device-side terminals 22 via the solder balls 41 on the back surface side of the suspension board with circuit 1. Further, on the front side of the suspension board with circuit 1, a power source, which is not shown, is electrically connected with supply-side terminals 23.

Thus, the suspension board with circuit 1 is obtained.

In the suspension board with circuit 1, since the device-side terminals 22 are formed directly on the back surface of the first insulating base layer 12, the gimbal portion 5 (terminal forming portion 10) can be made thinner.

The spacing between the back surface of the slider 39, that is, the mounting surface where the light emitting device 40 is mounted, and the device-side terminal 22 in the thickness direction can be made smaller. Therefore, the connection method therebetween can be appropriately selected depending on the thickness of the light emitting device 40 or the arrangement of the device-side terminal 22. Specifically, in the above description, the connection method using the solder balls 41 is adopted. However, for example, a connection method using a wire 53 may be adopted. As a result, the number of options for the connection method between the device-side terminal 22 and the light emitting device 40 can be increased.

The shape of the third opening 55 is not limited to the shape shown in FIGS. 16 and 17. However, an appropriate shape thereof is selected depending on the arrangement of the device-side terminal 22. The third opening 55 may be formed in a shape such as a rectangular shape in plane view, though not shown.

Figure 21:
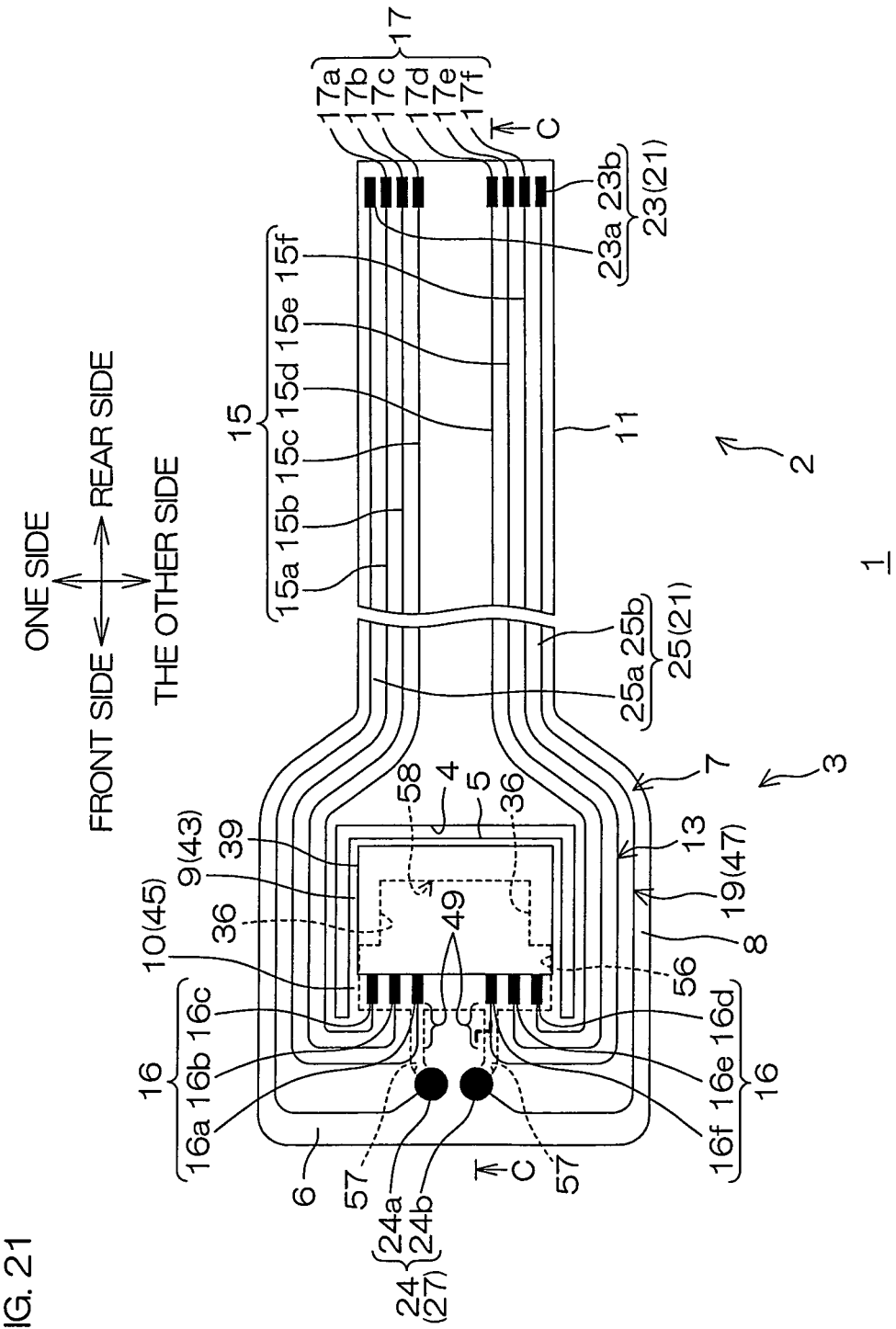
FIG. 21 is a plan view illustrating a suspension board with circuit of another embodiment according to the present invention.
Figure 22:
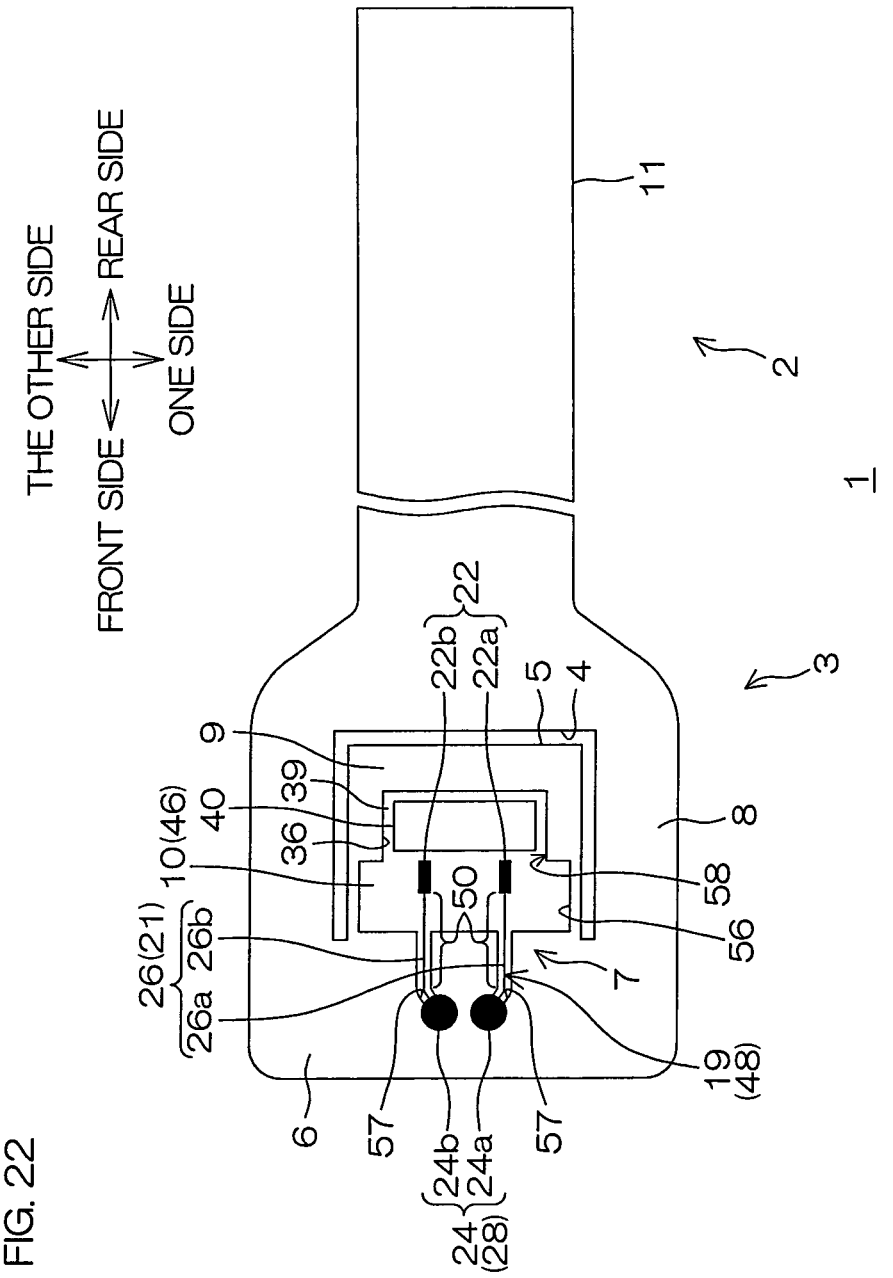
FIG. 22 is a bottom view of the suspension board with circuit shown in FIG. 21.
Figure 23:
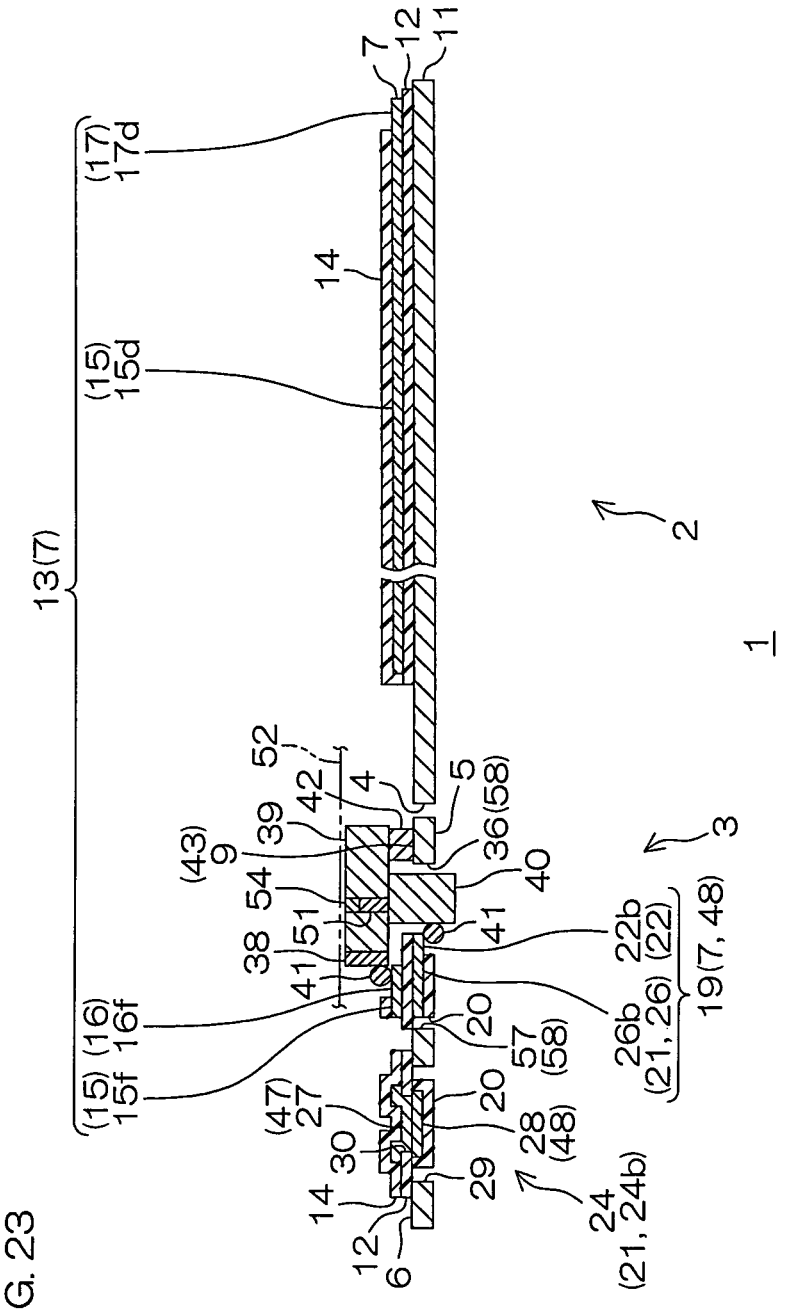
FIG. 23 is a sectional view of the suspension board with circuit taken along the line C-C shown in FIG. 21.
Figure 25:
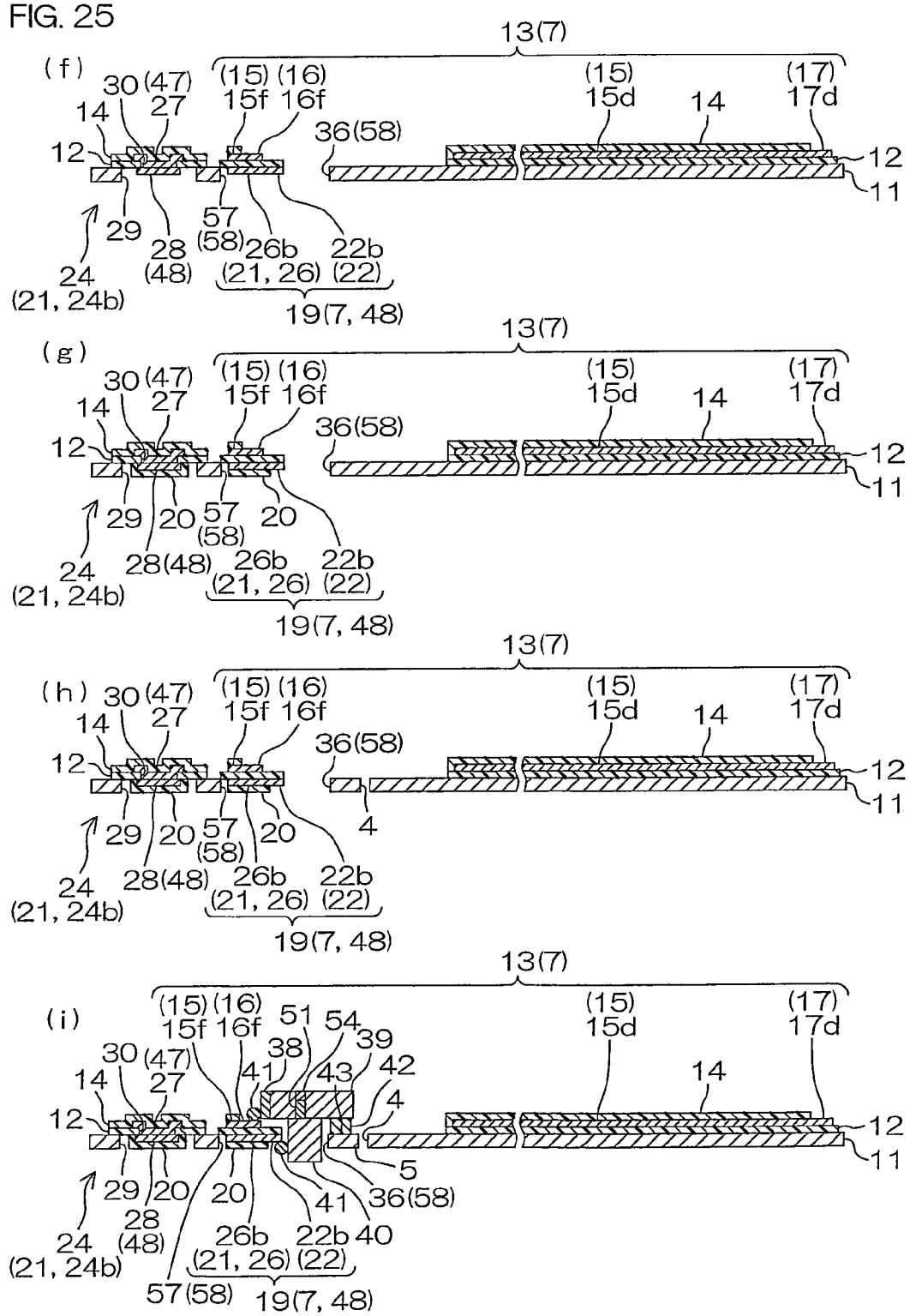
FIG. 25 is a process diagram explaining the method for producing the suspension board with circuit shown in FIG. 23, subsequent to FIG. 24, (f) showing the step of forming a back-side second conductive pattern, (g) showing the step of forming a second insulating cover layer, (h) showing the step of forming a slit portion in the metal supporting board, and (i) showing the step of mounting a slider.

FIG. 21 is a plan view illustrating a suspension board with circuit of another embodiment according to the present invention; FIG. 22 is a bottom view of the suspension board with circuit shown in FIG. 21; FIG. 23 is a sectional view of the suspension board with circuit taken along the line C-C shown in FIG. 21; and FIGS. 24 and 25 are process diagrams explaining a method for producing the suspension board with circuit shown in FIG. 23.

In the above description, the back-side power supply wires 26 are formed on the back surface of the second insulating base layer 18. However, for example, as shown in FIG. 23, the back-side power supply wires 26 may be formed on the back surface (under surface) of the first insulating base layer 12.

In FIGS. 21 and 22, the gimbal portion 5 and the wire turning portion 6 have a fourth opening 58 formed therein exposing the plurality of device-side terminals 22 and the back-side power supply wires 26 corresponding to the device-side terminals 22.

The fourth opening 58 is formed extending through the metal supporting board 11 of the gimbal portion 5 and the wire turning portion 6 in the thickness direction, including an insertion opening 36, a terminal opening 56 which communicates with the insertion opening 36, and a wire opening 57 which communicates with the terminal opening 56.

The insertion opening 36 and the terminal opening 56 are formed in the same shape as the insertion opening 36 and the terminal opening 56, respectively, both mentioned above.

A plurality of wire openings 57 are formed corresponding to the respective back-side power supply wires 26, each extending through the metal supporting board 11 of the wire turning portion 6 in the thickness direction. Each of the wire openings 57 is formed forward of the terminal opening 56 so as to communicate with the terminal opening 56, extends along each of the back-side power supply wires 26, and reaches the first metal opening 29 in the conductive portion 24. That is, the fourth opening 58 is in communication with the first metal opening 29.

Further, in the suspension board with circuit 1, the second insulating base layer 18 is not formed, and the back-side power supply wire 26 is formed directly on the back surface (under surface) of the first insulating base layer 12.

Next, a method for producing the suspension board with circuit 1 will be described with reference to FIGS. 24 and 25.

In this method, a metal supporting board 11 is first prepared, as shown in FIG. 24(a).

Then, as shown in FIG. 24(b), a varnish of photosensitive insulating material is applied to the surface of the metal supporting board 11, and is dried. Thereafter, the dried varnish is exposed to light and developed, and then heated to be cured, so that a first insulating base layer 12 is formed in the above-mentioned pattern.

Next, as shown in FIG. 24(c), a first conductive pattern 13 and a front-side second conductive pattern 47 are formed on the surface of the first insulating base layer 12 by an additive method or a subtractive method.

Then, as shown in FIG. 24(d), a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, as shown in FIG. 24(e), a first metal opening 29 and a fourth opening 58 are formed in the metal supporting board 11. The first metal opening 29 and the fourth opening 58 are formed by, for example, etching method such as dry etching (e.g., plasma etching) and wet etching (e.g., chemical etching), or for example, drill boring and laser processing. Preferably, the first metal opening 29 and the fourth opening 58 are formed by wet etching.

Thus, in the gimbal portion 5 and the wire turning portion 6, the back surface of the first insulating base layer 12 is exposed from the fourth opening 58 in the metal supporting board 11.

Next, as shown in FIG. 25(f), a back-side second conductive pattern 48 is formed on the back surface of the first insulating base layer 12 exposed from the fourth opening 58 in the metal supporting board 11 by an additive method or a subtractive method.

Thus, in the gimbal portion 5, the back-side second conductive pattern 48 is formed directly on the back surface of the first insulating base layer 12.

Then, as shown in FIG. 25(g), a varnish of photosensitive insulating material is applied to the back surface of the first insulating base layer 12 so as to cover the back-side second conductive pattern 48, and is dried. Thereafter, the dried varnish is exposed to light and developed, and then heated to be cured, so that a second insulating cover layer 20 is formed in the above-mentioned pattern.

Then, as shown in FIG. 25(h), a slit portion 4 is formed in the metal supporting board 11. The slit portion 4 is formed by, for example, etching method such as dry etching (e.g., plasma etching) and wet etching (e.g., chemical etching), or for example, drill boring and laser processing. At the same time, the metal supporting board 11 is trimmed.

Thereafter, as shown in FIG. 25(i), on the surface side of the suspension board with circuit 1, a slider 39 having a light emitting device 40 mounted on the back surface thereof is mounted in a slider mounting region 43 via an adhesive bond 42 so that the light emitting device 40 is inserted through the insertion opening 36. Then, a magnetic head 38 is electrically connected with head-side terminals 16 via solder balls 41, and an external circuit board, which is not shown, is electrically connected with external terminals 17.

Subsequently, the light emitting device 40 is electrically connected with device-side terminals 22 via the solder balls 41 on the back surface side of the suspension board with circuit 1. Further, on the front side of the suspension board with circuit 1, a power source, which is not shown, is electrically connected with supply-side terminals 23.

Thus, the suspension board with circuit 1 is obtained.

In the suspension board with circuit 1, since a back-side second conductive pattern 48, that is, back-side power supply wires 26 and the device-side terminals 22 are formed directly on the back surface of the first insulating base layer 12, the gimbal portion 5 (terminal forming portion 10) and the wire turning portion 6 can be made thinner.

The spacing between the back surface of the slider 39, that is, the mounting surface where the light emitting device 40 is mounted, and the device-side terminal 22 in the thickness direction can be made smaller. Therefore, as described above, the number of options for the connection method between the device-side terminal 22 and the light emitting device 40 can be increased.

Furthermore, since a second insulating base layer 18 is not formed on the suspension board with circuit 1, the production method can eliminate the need for the step (see FIGS. 5(f), 10(f), 14(f), and 19(f)) of forming the second insulating base layer 18. Therefore, the number of production steps can be reduced, thereby resulting in reduction of production cost.

Figure 26:
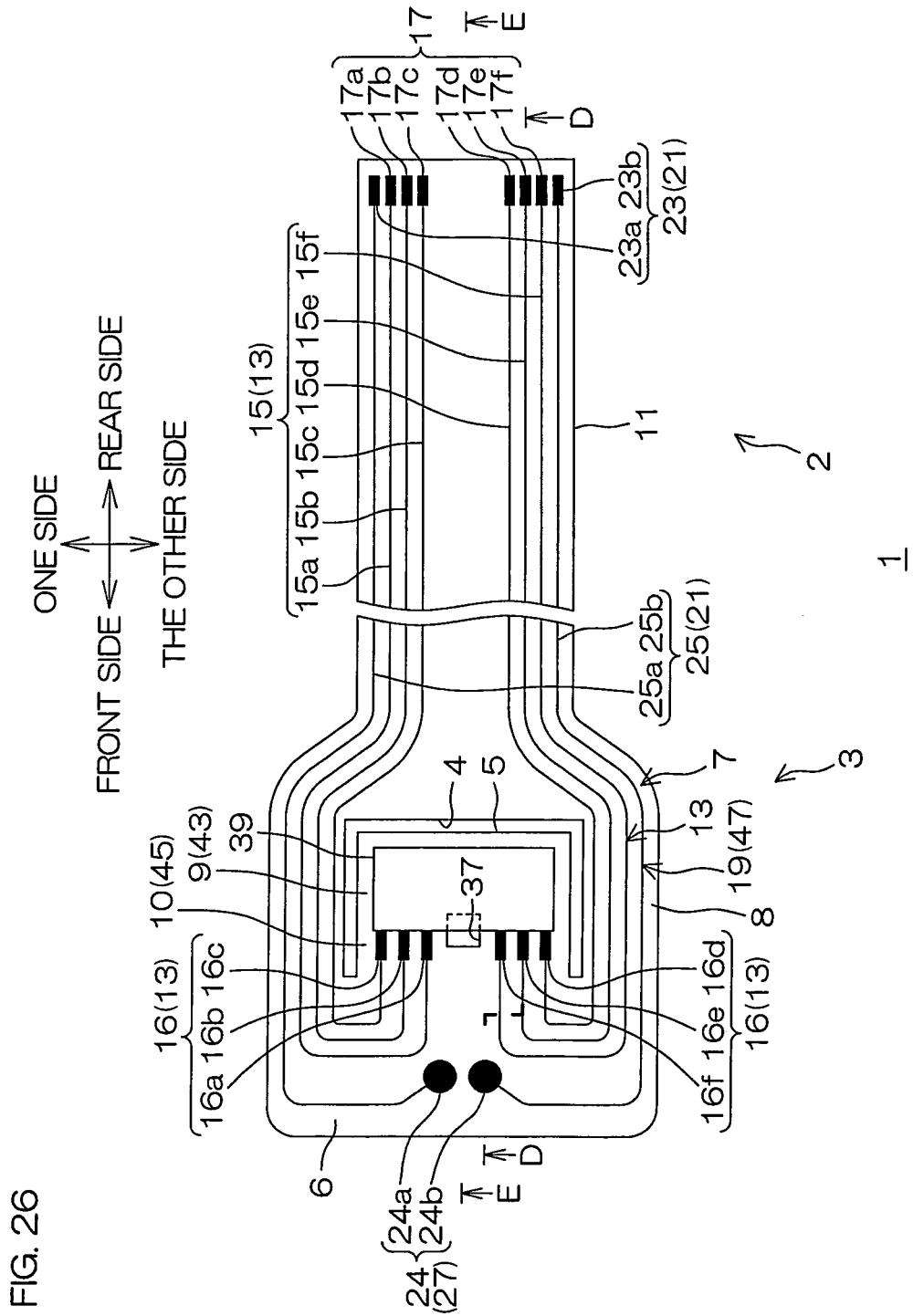
FIG. 26 is a plan view illustrating a suspension board with circuit of another embodiment according to the present invention.
Figure 27:
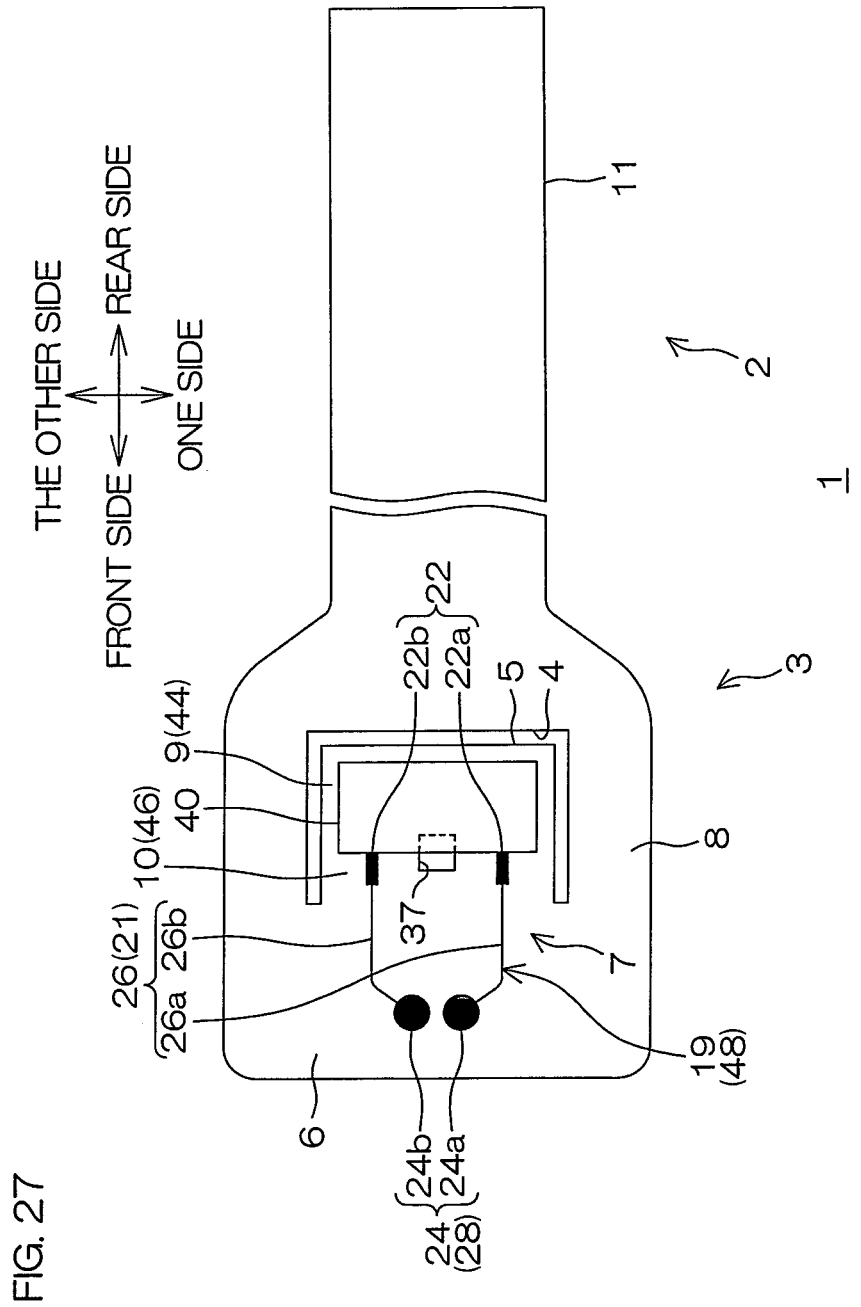
FIG. 27 is a bottom view of the suspension board with circuit shown in FIG. 26.

FIG. 26 is a plan view illustrating a suspension board with circuit of another embodiment according to the present invention; FIG. 27 is a bottom view of the suspension board with circuit shown in FIG. 26; and FIG. 28 is a sectional view of the suspension board with circuit shown in FIG. 26, (a) showing a sectional view thereof taken along the line D-D, and (b) showing a sectional view thereof taken along the line E-E.

In the above description, the light emitting device 40 is mounted directly on the back surface of the slider 39. However, for example, as shown in FIG. 28, the light emitting device 40 may be mounted directly on the metal supporting board 11.

Figure 28:
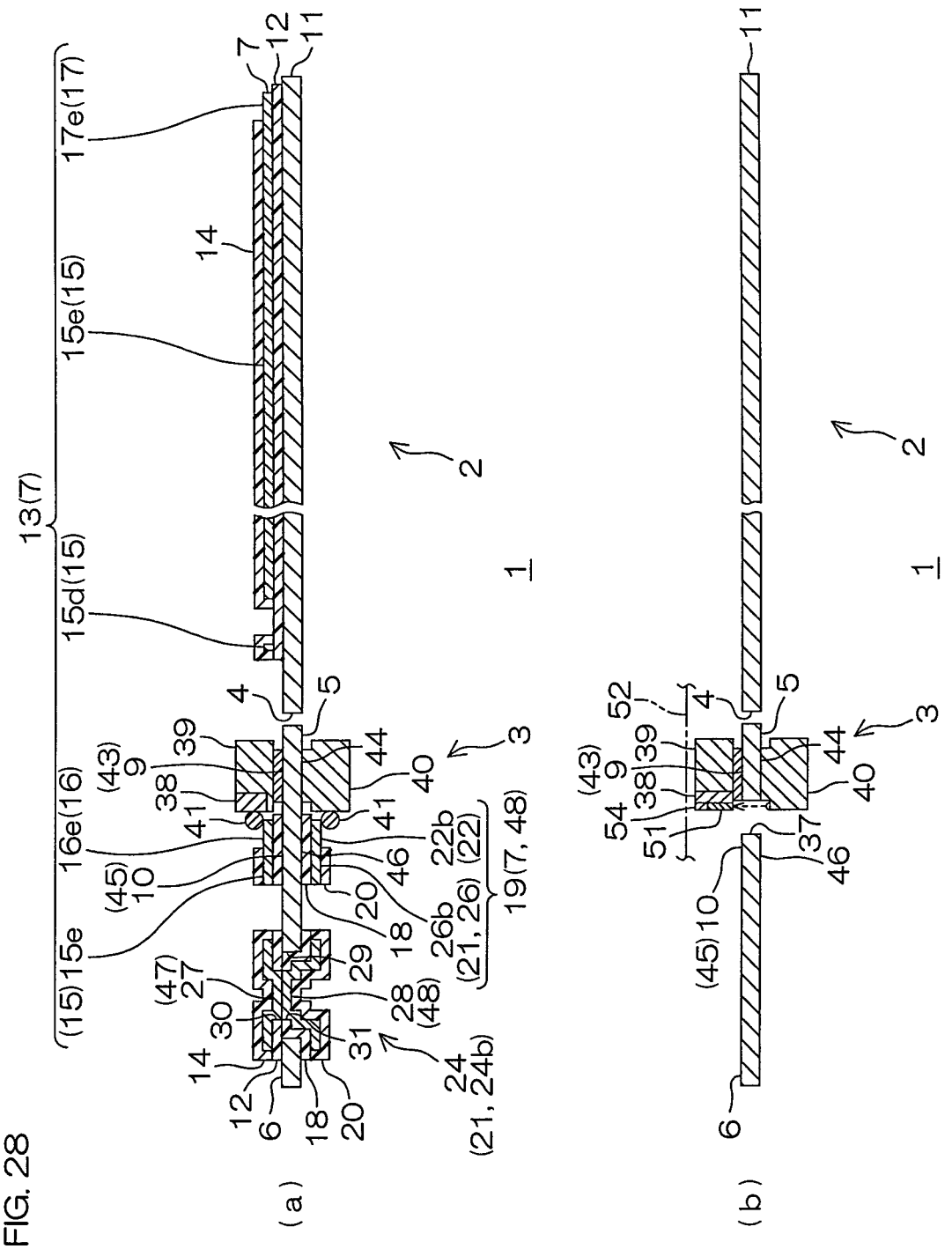
FIG. 28 is a sectional view of the suspension board with circuit shown in FIG. 26, (a) showing a sectional view thereof taken along the line D-D, and (b) showing a sectional view thereof taken along the line E-E.

In FIGS. 27 and 28, specifically, the light emitting device 40 is formed directly on the back surface of the mounting region 9.

The mounting region 9 does not have the above-mentioned insertion opening 36 (FIGS. 2 and 3), and the back surface (under surface) of the mounting region 9 is defined as a device mounting region 44 where the light emitting device 40 is mounted. The device mounting region 44 is opposed to the slider mounting region 43 in the thickness direction.

The device-side terminals 22 are spaced apart from each other in the widthwise direction along the front end edge of the device mounting region 44. The device-side terminal 22 and the head-side terminal forming portion 45 are opposed to each other in the thickness direction.

The gimbal portion 5 of the mounting portion 3 has an emission opening 37 formed therein serving as a second opening.

The emission opening 37 is formed in a generally rectangular shape in plane view extending through the suspension board with circuit 1 in the thickness direction so that the light (indicated by the dashed line arrow in FIG. 28(*b*)) emitted from the light emitting device 40 passes through and then enters an optical waveguide 51. The emission opening 37 is formed in the widthwise center of the gimbal portion 5 and between the mounting region 9 and the terminal forming portion 10.

The light emitting device 40 is mounted directly on the device mounting region 44, with its emission port being opposed to the emission opening 37 in the thickness direction. The terminal of the light emitting device 40 is electrically connected with the device-side terminals 22 via the solder balls 41.

The slider 39 is mounted with the magnetic head 38 that is electrically connected with the head-side terminals 16 via the solder balls 41. The slider 39 is formed so that the back portion (lower end portion) of the optical waveguide 51 faces the emission opening 37, and is spaced in opposed relation to the emission port in the light emitting device 40 in the thickness direction.

In order to obtain the suspension board with circuit 1, though not shown, for example, a metal supporting board 11 is first prepared, and then, a varnish of photosensitive insulating material is applied to the surface of the metal supporting board 11, and is dried. Thereafter, the dried varnish is exposed to light and developed, and then heated to be cured, so that a first insulating base layer 12 is formed in a pattern formed with the above-mentioned first center opening 30. Next, a first conductive pattern 13 and a front-side second conductive pattern 47 are formed on the surface of the first insulating base layer 12 by an additive method or a subtractive method.

Then, a varnish of photosensitive insulating material is applied to the surface of the first insulating base layer 12 so as to cover the first conductive pattern 13 and the front-side second conductive pattern 47, and is dried. Thereafter, the dried varnish is exposed to light and developed, and then heated to be cured, so that a first insulating cover layer 14 is formed in the above-mentioned pattern.

Then, a varnish of photosensitive insulating material is applied to the back surface of the metal supporting board 11, and is dried. Thereafter, the dried varnish is exposed to light and developed, and then heated to be cured, so that a second insulating base layer 18 is formed in a pattern formed with the above-mentioned second center opening 31. Next, a back-side second conductive pattern 48 is formed on the back surface of the second insulating base layer 18 by an additive method or a subtractive method.

Then, a varnish of photosensitive insulating material is applied to the back surface of the second insulating base layer 18 so as to cover the back-side second conductive pattern 48, and is dried. Thereafter, the dried varnish is exposed to light and developed, and then heated to be cured, so that the second insulating base layer 18 is formed.

Then, a slit portion 4 and an emission opening 37 are formed in the metal supporting board 11 in the same manner as above, and at the same time, the metal supporting board 11 is trimmed.

Thereafter, on the front side of the suspension board with circuit 1, a slider 39 having a magnetic head 38 mounted thereon is mounted in a slider mounting region 43 via an adhesive bond 42. Subsequently, the magnetic head 38 is electrically connected with head-side terminals 16 via solder balls 41. Further, on the front side of the suspension board with circuit 1, an external circuit board, which is not shown, is electrically connected with external terminals 17.

On the back side of the suspension board with circuit 1, a light emitting device 40 is mounted in a device mounting region 44 so that an emission port is opposed to the emission opening 37 and an optical waveguide 51. Subsequently, the light emitting device 40 is electrically connected with the device-side terminals 22 via the solder balls 41. Further, on the front side of the suspension board with circuit 1, a power source, which is not shown, is electrically connected with supply-side terminals 23.

Thus, the suspension board with circuit 1 is obtained.

In the suspension board with circuit 1, the light (indicated by the dashed line arrow in FIG. 28(*b*)) emitted from the light emitting device 40 passes through the emission opening 37, enters the optical waveguide 51. Subsequently, it passes through the optical waveguide 51 and then reaches a near-field light generation member 54, which finally generates a near-field light.

Preferably, as shown in FIG. 3, the light emitting device 40 is mounted directly on the back surface of the slider 39.

As compared with the suspension board with circuit 1 shown in FIG. 28, in the suspension board with circuit 1 shown in FIG. 3, the light emitting device 40 is preliminarily mounted on the slider 39, so that the positioning accuracy (optical accuracy) of the light emitting device 40 with respect to the optical waveguide 51 can be improved.

Further, since the light emitting device 40 is inserted through the insertion opening 36, it can be made thinner in the device mounting region 44.

Figure 29:
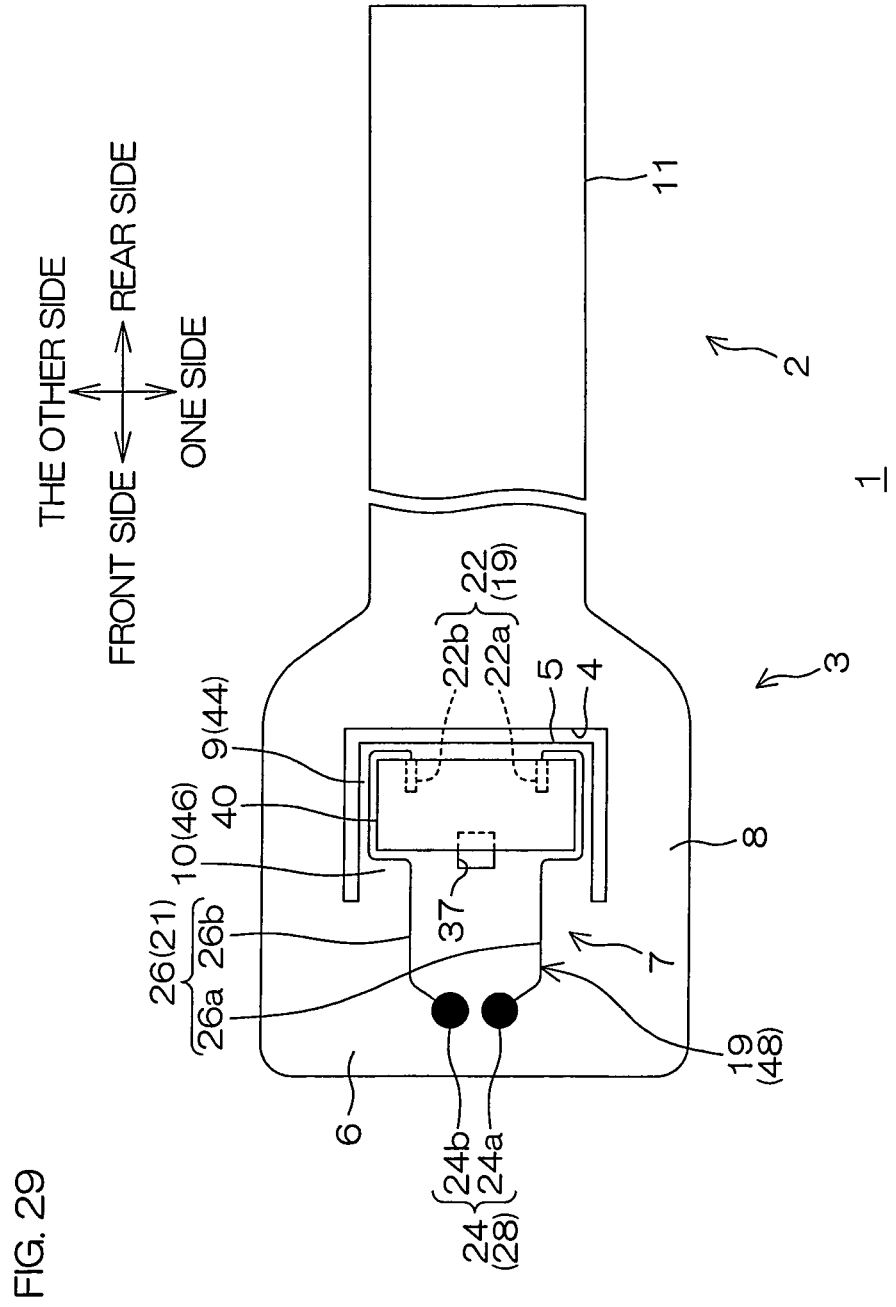
FIG. 29 is a bottom view illustrating a suspension board with circuit of another embodiment according to the present invention.

FIG. 29 is a bottom view illustrating a suspension board with circuit of another embodiment according to the present invention.

In the above description, the device-side terminals 22 are formed in the device-side terminal forming portion 46. However, as shown in FIG. 29, for example, they may be formed in the device mounting region 44.

In FIG. 29, the device-side terminals 22 are spaced apart from each other in the widthwise direction. The first device-side terminal 22*a* and the second device-side terminal 22*b* are arranged in line along the rear end edge of the device mounting region 44.

The first back-side power supply wire 26*a* is arranged so as to make a detour around the device mounting region 44 toward one side (outer side) in the widthwise direction and the rear end side in the gimbal portion 5, and the rear end portion thereof is connected with the rear end portion of the second device-side terminal 22a. Likewise, the second back-side power supply wire 26b is arranged so as to make a detour around the device mounting region 44 toward the other side (outer side) in the widthwise direction and the rear end side in the gimbal portion 5, and the rear end portion thereof is connected to the rear end portion of the second device-side terminal 22b.

Figure 30:
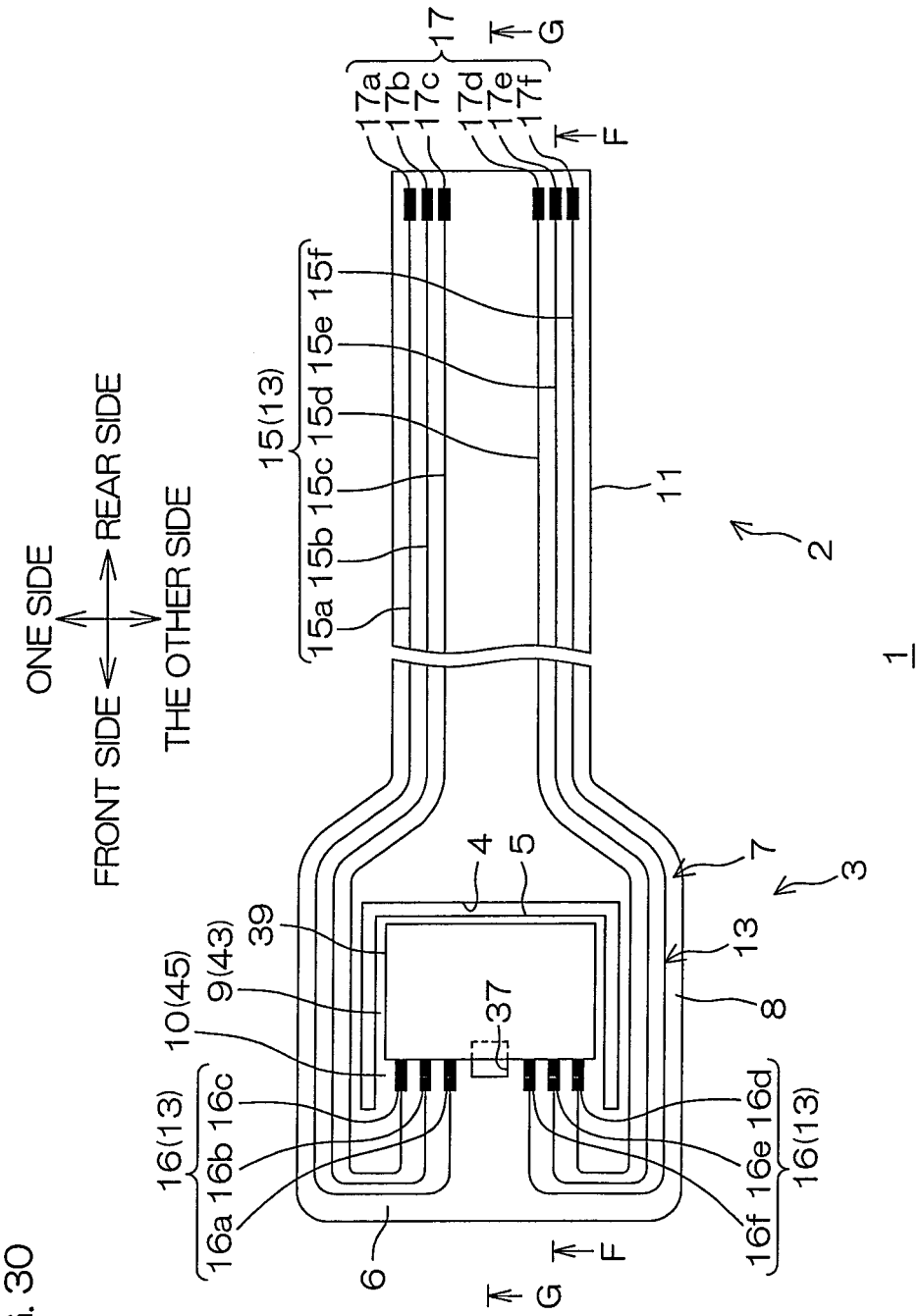
FIG. 30 is a plan view illustrating a suspension board with circuit of another embodiment according to the present invention.
Figure 31:
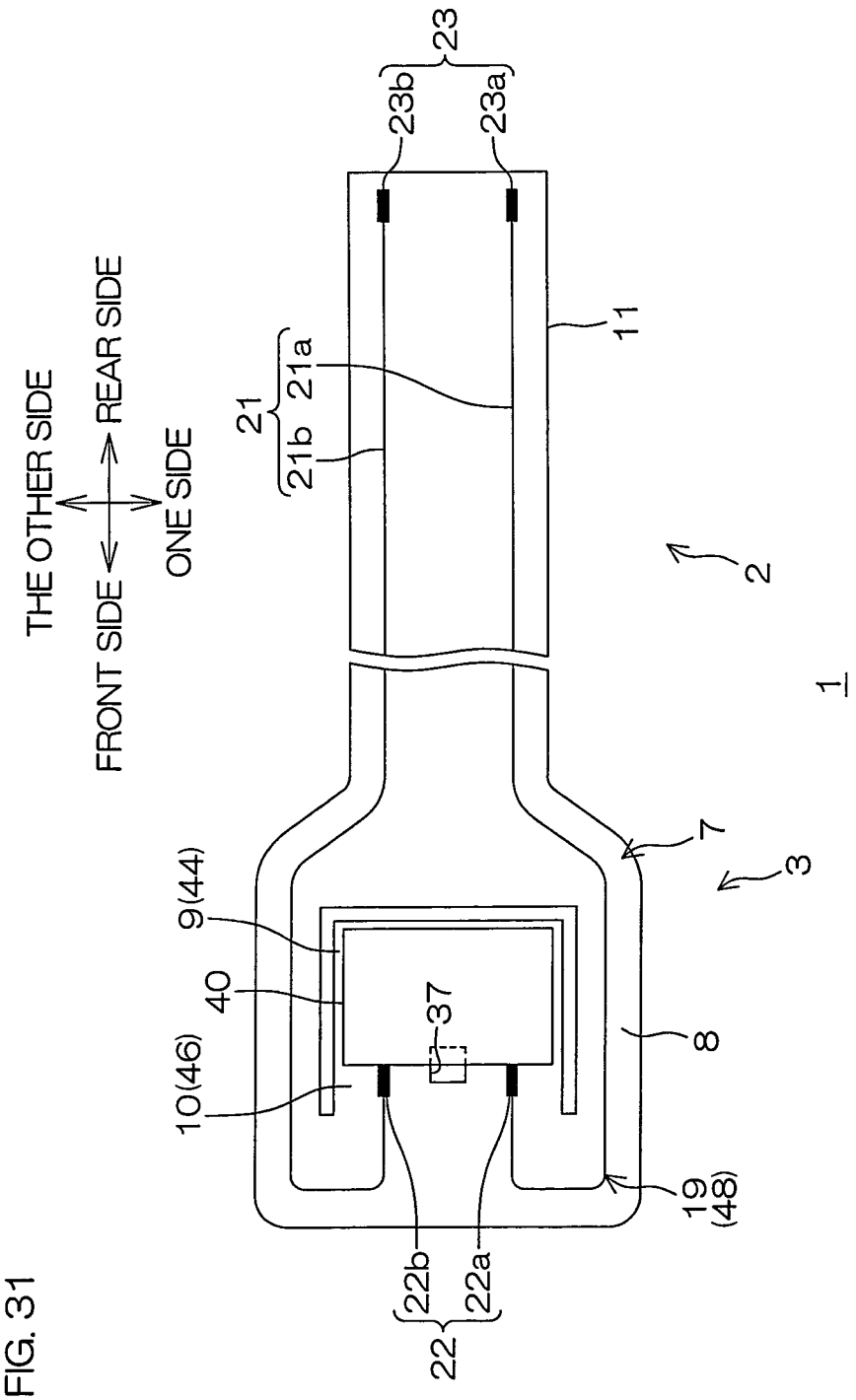
FIG. 31 is a bottom view of the suspension board with circuit shown in FIG. 30.

FIG. 30 is a plan view illustrating a suspension board with circuit of another embodiment according to the present invention; FIG. 31 is a bottom view of the suspension board with circuit shown in FIG. 30; and FIG. 32 is a sectional view of the suspension board with circuit shown in FIG. 30, (a) showing a sectional view thereof taken along the line F-F, and (b) showing a sectional view thereof taken along the line G-G.

In the above description, the supply-side terminals 23 are provided on the front side of the suspension board with circuit 1, which allows the supply-side terminals 23 to conduct with the device-side terminals 22 in the thickness direction through the conductive portions 24 (front-side power supply wire 25 and back-side power supply wire 26). However, for example, as shown in FIGS. 30 to 32, both the supply-side terminals 23 and the power supply wires 21 may be provided on the back side of the suspension board with circuit 1, which allows the supply-side terminals 23 and the device-side terminals 22 to conduct through the power supply wires 21 on the back side of the suspension board with circuit 1, without providing the conductive portions 24 on the power supply wires 21.

Figure 32:
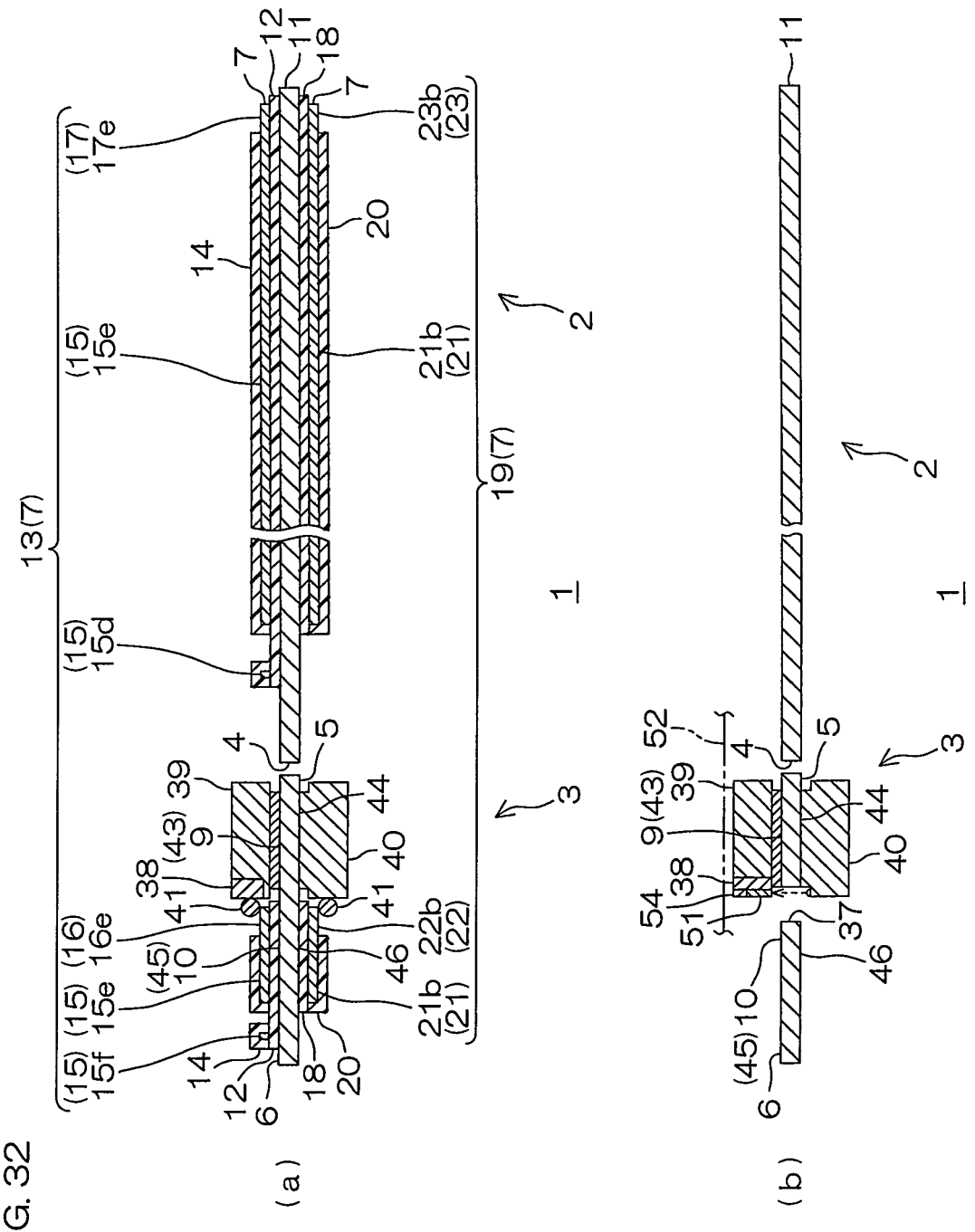
FIG. 32 is a sectional view of the suspension board with circuit shown in FIG. 30, (a) showing a sectional view thereof taken along the line F-F, and (b) showing a sectional view thereof taken along the line G-G.

In FIGS. 30 to 32, the second conductive pattern 19 continuously includes the device-side terminals 22, the supply-side terminals 23, and the power supply wires 21 for connecting the device-side terminals 22 and the supply-side terminals 23.

The power supply wires 21 are provided on the back surface of the metal supporting board 11, and are arranged over the wire portion 2 and the mounting portion 3.

As shown in FIGS. 31 and 32, the supply-side terminals 23 are arranged in the rear end portion of the back surface of the wire portion 2.

The supply-side terminals 23 are opposed to the external terminals 17 in the thickness direction.

In order to obtain the suspension board with circuit 1, though not shown, for example, a metal supporting board 11 is first prepared, and then, a varnish of photosensitive insulating material is applied to the surface of the metal supporting board 11, and is dried. Thereafter, the dried varnish is exposed to light and developed, and then heated to be cured, so that a first insulating base layer 12 is formed in the above-mentioned pattern. Next, a first conductive pattern 13 is formed on the surface of the first insulating base layer 12 by an additive method or a subtractive method.

Then, a varnish of photosensitive insulating material is applied to the surface of the first insulating base layer 12 so as to cover the first conductive pattern 13, and is dried. Thereafter, the dried varnish is exposed to light and developed, and then heated to be cured, so that a first insulating cover layer 14 is formed in the above-mentioned pattern.

Then, a varnish of photosensitive insulating material is applied to the back surface of the metal supporting board 11, and is dried. Thereafter, the dried varnish is exposed to light and developed, and then heated to be cured, so that a second insulating base layer 18 is formed in a pattern formed in the above-mentioned pattern. Next, a second conductive pattern 19 is formed on the back surface of the second insulating base layer 18 by an additive method or a subtractive method.

Then, a varnish of photosensitive insulating material is applied to the back surface of the second insulating base layer 18 so as to cover the second conductive pattern 19, and is dried. Thereafter, the dried varnish is exposed to light and developed, and then heated to be cured, so that the second insulating base layer 18 is formed.

Then, a slit portion 4 and an emission opening 37 are formed in the metal supporting board 11 in the same manner as above, and at the same time, the metal supporting board 11 is trimmed.

Thereafter, on the front side of the suspension board with circuit 1, a slider 39 is mounted in a slider mounting region 43 via an adhesive bond 42. Subsequently, a magnetic head 38 is electrically connected with head-side terminals 16 via solder balls 41. Further, on the front side of the suspension board with circuit 1, an external circuit board, which is not shown, is electrically connected with external terminals 17.

On the back side of the suspension board with circuit 1, a light emitting device 40 is mounted in a device mounting region 44 so that an emission port is opposed to the emission opening 37 and an optical waveguide 51. Subsequently, the light emitting device 40 is electrically connected with the device-side terminals 22 via the solder balls 41. Further, on the back side of the suspension board with circuit 1, a power source, which is not shown, is electrically connected with supply-side terminals 23.

Thus, the suspension board with circuit 1 is obtained.

The suspension board with circuit 1 does not have a conductive portion 24, so that, in the method for producing the suspension board with circuit 1, the step (see FIGS. 5(e) and 15(e)) of forming the first metal opening 29 and the step (FIG. 11(e)) of forming the annular opening 32 can be omitted. Therefore, the number of production steps can be reduced, thereby resulting in reduction of the production cost.

In the above-mentioned suspension board with circuit 1 shown in FIGS. 30 to 32, the light emitting device 40 is mounted directly on the metal supporting board 11. However, for example, though not shown, an insertion opening 36 is formed in place of the emission opening 37, and the light emitting device 40 can be mounted directly on the back surface of the slider 39 while inserting through the insertion opening 36.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising a conductive pattern, comprising:
    a slider arranged on an upper surface side of the suspension board with circuit and mounted with a magnetic head, the magnetic head being electrically connected with the conductive pattern; and
    a light emitting device inserted in a first opening extending through the suspension board with circuit in the thickness direction and exposed from the back surface side of the suspension board with circuit and electrically connected with the conductive pattern,
    wherein the conductive pattern comprises:
        a first terminal provided on an upper surface of the suspension board with circuit and electrically connected with the magnetic head;
        a first wire electrically connected to the first terminal, the first wire being formed on the upper surface of the suspension board with circuit;

a second terminal provided on the back surface of the suspension board with circuit and electrically connected with the light emitting device; and a second wire electrically connected to the second terminal, the second wire comprising:

a front-side wire formed on the upper surface of the suspension board with circuit; and a conductive portion allowing the front-side wire and the second wire to conduct in the thickness direction of the suspension board with circuit at a position different from that of the first opening.

2. The suspension board with circuit according to claim 1, wherein the slider comprises an optical waveguide, the light emitting device is mounted on the back surface of the slider so as to be opposed to the optical waveguide in the thickness direction.

3. The suspension board with circuit according to claim 1, wherein the slider and the light emitting device are opposed to each other in the thickness direction.

4. The suspension board with circuit according to claim 1, wherein the second wire further comprises a back-side wire formed on the back surface of the suspension board with circuit and electrically connecting the conductive portion and the second terminal.

5. The suspension board with circuit according to claim 4, wherein the conductive portion is provided on one end portion where the magnetic head on the suspension board with circuit is mounted.

6. The suspension board with circuit according to claim 4, wherein the conductive portion comprises:

a front-side conductive portion formed continuously with the front-side wire; and a back-side conductive portion formed continuously with the back-side wire, the front-side conductive portion and the back-side conductive portion being electrically connected with each other.

7. The suspension board with circuit according to claim 6, further comprising:

a first insulating layer formed under the front-side wire;

a metal supporting board formed under the first insulating layer; and a second insulating layer formed under the metal supporting board and on the back-side wire, wherein the metal supporting board has a first metal opening formed extending therethrough in the thickness direction, the first insulating layer covers the peripheral end edge of the first metal opening so as to have a first center opening formed extending through the first insulating layer in the thickness direction at the center of the first metal opening, the first center opening being filled with the front-side conductive portion, the second insulating layer covers the peripheral end edge of the first metal opening so as to have a second center opening formed in opposed relation to the first center opening in the thickness direction and extending through the second insulating layer in the thickness direction, the second center opening being filled with the back-side conductive portion, and the front-side conductive portion and the back-side conductive portion are in direct contact with each other in an opposed portion between the first center opening and the second center opening.

8. The suspension board with circuit according to claim 6, further comprising:

a first insulating layer formed under the front-side wire;

a metal supporting board formed under the first insulating layer; and a second insulating layer formed under the metal supporting board and on the back-side wire, wherein the metal supporting board has an annular opening formed in an annular shape extending therethrough in the thickness direction, the conductive portion further comprises an insulated conductive portion arranged within the annular opening and insulated from the metal supporting board around the annular opening, the first insulating layer covers the annular opening and has a first insulating opening formed exposing the insulated conductive portion, the first insulating opening being filled with the front-side conductive portion, the second insulating layer covers the peripheral end edge of the annular opening and has a second insulating opening formed exposing the insulated conductive portion, the second insulating opening being filled with the back-side conductive portion, and the front-side conductive portion and the back-side conductive portion are electrically connected with each other through the insulated conductive portion.

9. The suspension board with circuit according to claim 6, further comprising:

a first insulating layer formed under the front-side wire; and a metal supporting board formed under the first insulating layer, wherein the metal supporting board has a first metal opening formed extending therethrough in the thickness direction, the first insulating layer covers the peripheral end edge of the first metal opening so as to form a first center opening extending through the first insulating layer in the thickness direction at the center of the first metal opening, the first center opening being filled with the front-side conductive portion, the back-side conductive portion is arranged within the first metal opening in opposed relation to the first center opening, and the front-side conductive portion and the back-side conductive portion are in direct contact with each other in the first center opening.

10. The suspension board with circuit according to claim 9, wherein the second terminal is formed directly on the back surface of the first insulating layer.

11. The suspension board with circuit according to claim 9, wherein the second terminal and the second wire are formed directly on the back surface of the first insulating layer.

12. The suspension board with circuit according to claim 1, wherein the slider comprises an optical waveguide, the light emitting device is mounted on the back surface of the slider so as to be opposed to and brought in contact with the optical waveguide in the thickness direction, and the light emitting device passes through the first opening and protrudes from the back surface side of the suspension board with circuit.

13. The suspension board with circuit according to claim 12, wherein the slider completely covers the first opening from above.

* * * * *